(12) United States Patent
Nakaya et al.

(10) Patent No.: US 10,290,756 B2
(45) Date of Patent: May 14, 2019

(54) MULTILAYER STRUCTURE, DEVICE USING THE SAME, METHOD FOR PRODUCING THE MULTILAYER STRUCTURE, AND METHOD FOR PRODUCING THE DEVICE

(71) Applicant: KURARAY CO., LTD., Kurashiki-shi (JP)

(72) Inventors: Masakazu Nakaya, Kurashiki (JP); Noboru Higashida, Tainai (JP); Kentaro Yoshida, Houston, TX (US); Ryoichi Sasaki, Kurashiki (JP); Manabu Shibata, Kurashiki (JP); Tatsuya Oshita, Kurashiki (JP)

(73) Assignee: KURARAY CO., LTD., Kurashiki-shi (JP)

( * ) Notice: Subject to any disclaimer, the term of this patent is extended or adjusted under 35 U.S.C. 154(b) by 1 day.

(21) Appl. No.: 14/407,582

(22) PCT Filed: Jun. 12, 2013

(86) PCT No.: PCT/JP2013/003697
§ 371 (c)(1),
(2) Date: Dec. 12, 2014

(87) PCT Pub. No.: WO2013/187064
PCT Pub. Date: Dec. 19, 2013

(65) Prior Publication Data
US 2015/0155409 A1    Jun. 4, 2015

(30) Foreign Application Priority Data

Jun. 14, 2012    (JP) ................ 2012-134897

(51) Int. Cl.
| | | |
|---|---|---|
| *B32B 7/12* | (2006.01) | |
| *H01L 31/048* | (2014.01) | |
| *H01L 31/049* | (2014.01) | |
| *H01L 31/18* | (2006.01) | |
| *H01L 33/56* | (2010.01) | |
| *H01L 51/52* | (2006.01) | |
| *H01L 51/56* | (2006.01) | |
| *B32B 27/08* | (2006.01) | |
| *B32B 27/30* | (2006.01) | |

(52) U.S. Cl.
CPC ............ *H01L 31/0481* (2013.01); *B32B 7/12* (2013.01); *B32B 27/08* (2013.01); *B32B 27/30* (2013.01); *H01L 31/049* (2014.12); *H01L 31/18* (2013.01); *H01L 33/56* (2013.01); *H01L 51/5253* (2013.01); *H01L 51/56* (2013.01); *B32B 2255/10* (2013.01); *B32B 2255/20* (2013.01); *B32B 2307/712* (2013.01); *B32B 2307/7242* (2013.01); *B32B 2307/7246* (2013.01); *B32B 2457/00* (2013.01); *H01L 2251/5338* (2013.01); *H01L 2933/005* (2013.01); *Y02E 10/50* (2013.01); *Y10T 428/31855* (2015.04)

(58) Field of Classification Search
CPC ............ B32B 2255/10; B32B 2255/20; B32B 2307/712; B32B 2307/7242; B32B 2307/7246; B32B 2457/00; B32B 27/08; B32B 27/30; B32B 7/12; H01L 2251/5338; H01L 2933/005; H01L 31/0481; H01L 31/049; H01L 31/18; H01L 33/56; H01L 51/5253; H01L 51/56; Y02E 10/50; Y10T 428/31855
USPC ..................................... 428/472.3
See application file for complete search history.

(56) References Cited

U.S. PATENT DOCUMENTS

| | | | | |
|---|---|---|---|---|
| 4,871,711 A | * | 10/1989 | Matin ................. | B01J 20/3248 210/198.2 |
| 4,904,634 A | * | 2/1990 | Wieserman .......... | B01J 20/3248 502/401 |
| 9,260,622 B2 | * | 2/2016 | Yoshida ............... | C09D 123/02 |
| 2004/0206267 A1 | | 10/2004 | Sambasivan et al. | |
| 2004/0209084 A1 | * | 10/2004 | Yamaya ................ | C09D 4/00 428/421 |

(Continued)

FOREIGN PATENT DOCUMENTS

| | | |
|---|---|---|
| JP | 2006-116737 | 5/2006 |
| JP | 2006-515535 | 6/2006 |

(Continued)

OTHER PUBLICATIONS

International Search Report dated Sep. 17, 2013, in PCT/JP2013/003697, filed Jun. 12, 2013.

*Primary Examiner* — David Sample
*Assistant Examiner* — Elizabeth Collister
(74) *Attorney, Agent, or Firm* — Oblon, McClelland, Maier & Neustadt, L.L.P.

(57) ABSTRACT

Provided are a novel multilayer structure that can be used to protect a device and a device using the multilayer structure. The disclosed multilayer structure is a multilayer structure including a substrate and a barrier layer stacked on the substrate. The 3% strain tension of the substrate in at least one direction is at least 2000 N/m. The barrier layer contains a reaction product (R). The reaction product (R) is a reaction product formed by a reaction at least between a metal oxide (A) and a phosphorus compound (B). In an infrared absorption spectrum of the barrier layer in a range of 800 to 1400 $cm^{-1}$, a wavenumber ($n^1$) at which maximum infrared absorption occurs is in a range of 1080 to 1130 $cm^{-1}$. A metal atom constituting the metal oxide (A) is essentially an aluminum atom.

16 Claims, No Drawings

(56) References Cited

U.S. PATENT DOCUMENTS

| 2005/0261427 | A1* | 11/2005 | Saito | B32B 5/18 |
| | | | | 525/88 |
| 2006/0057407 | A1 | 3/2006 | Sambasivan et al. | |
| 2010/0279000 | A1 | 11/2010 | Sambasivan et al. | |
| 2012/0128993 | A1 | 5/2012 | Sambasivan et al. | |
| 2013/0034674 | A1 | 2/2013 | Yoshida et al. | |

FOREIGN PATENT DOCUMENTS

| JP | 2006-175784 | 7/2006 |
| JP | 2008-516015 | 5/2008 |
| JP | 2011-14559 | 1/2011 |
| JP | 2011-104781 | 6/2011 |
| JP | 2012-15294 | 1/2012 |
| WO | 2005/003033 A2 | 1/2005 |
| WO | 2006/042116 A2 | 4/2006 |
| WO | 2011/122036 A1 | 10/2011 |

* cited by examiner

MULTILAYER STRUCTURE, DEVICE USING THE SAME, METHOD FOR PRODUCING THE MULTILAYER STRUCTURE, AND METHOD FOR PRODUCING THE DEVICE

TECHNICAL FIELD

The present invention relates to a multilayer structure, a device using the same, a method for producing the multilayer structure, and a method for producing the device.

BACKGROUND ART

Devices such as electronic devices with displays and solar cells need light-transmitting protective members to protect their surfaces. Among these devices, flexible displays and flexible solar cells have recently been used. Since thick glass plates cannot be used in such flexible devices, the flexible devices need alternatives to such thick glass plates as protective members.

As such protective members, protective members for solar cells are conventionally proposed (Patent Literatures 1 and 2). Patent Literature 1 discloses a protective film in which a deposited silicon oxide film formed by the CVD method and a deposited silicon oxide film formed by reactive ion cluster beam deposition are stacked on a fluorine-containing resin film. Patent Literature 2 discloses a protective sheet including a plastic film, and a first inorganic layer, an organic layer and a second inorganic layer that are stacked on the plastic film.

The barrier properties are important in protecting a device. In particular, a flexible device needs a flexible protective member with high barrier properties. Patent Literature 3 discloses an example of a barrier layer having barrier properties.

CITATION LIST

Patent Literature

Patent Literature 1: JP 2011-014559 A
Patent Literature 2: JP 2012-015294 A
Patent Literature 3: WO 2011/122036 A1

SUMMARY OF INVENTION

Technical Problem

In general, protective sheets for protecting devices require higher barrier properties than packaging materials for food and the like. Therefore, currently, there is a need for protective sheets having more reliable barrier properties as protective sheets for protecting devices. Under these circumstances, it is an object of the present invention to provide a novel multilayer structure that can be used to protect a device and a device using the multilayer structure.

Solution to Problem

As a result of a study of the barrier properties of a barrier layer, the present inventors have newly found that the barrier properties of the barrier layer is affected by a substrate on which the barrier layer is formed. The present invention is the invention based on this new finding.

The multilayer structure of the present invention is a multilayer structure including: a substrate; and a barrier layer stacked on the substrate. The 3% strain tension of the substrate in at least one direction is at least 2000 N/m. The barrier layer contains a reaction product (R). The reaction product (R) is a reaction product formed by a reaction at least between a metal oxide (A) and a phosphorus compound (B). In an infrared absorption spectrum of the barrier layer in a range of 800 to 1400 $cm^{-1}$, a wavenumber ($n^1$) at which maximum infrared absorption occurs is in a range of 1080 to 1130 $cm^{-1}$. A metal atom constituting the metal oxide (A) is essentially an aluminum atom.

The device of the present invention is a device including a protective sheet for protecting a surface of the device. The protective sheet is the multilayer structure of the present invention.

The method of the present invention for producing a multilayer structure is a method for producing a multilayer structure including a substrate whose 3% strain tension in at least one direction is at least 2000 N/m and a barrier layer formed on the substrate. The method includes the steps of: (i) feeding the substrate from a first roll of the substrate in a feed direction in such a manner that the feed direction coincides with the at least one direction; (ii) forming a precursor layer of the barrier layer on the substrate; and (iii) winding the substrate, which has undergone the step (ii), on a second roll. The step (ii) includes the steps of: mixing a metal oxide (A), at least one compound having a site capable of reacting with the metal oxide (A), and a solvent, so as to prepare a coating liquid (U) containing the metal oxide (A), the at least one compound, and the solvent; and applying the coating liquid (U) onto the substrate so as to form the precursor layer on the substrate. The at least one compound contains a phosphorus compound (B). The number of moles of metal atom contained in the at least one compound is in a range of 0 to 1 times the number of moles of phosphorus atom contained in the phosphorus compound (B). A metal atom constituting the metal oxide (A) is essentially an aluminum atom.

The method of the present invention for producing a device is a method for producing a flexible device including a protective sheet for protecting a surface of the device. The method includes the steps of; (a) preparing a protective sheet that is wound on a roll and that includes a substrate whose 3% strain tension in at least one direction is at least 2000 N/m and a barrier layer formed on the substrate; and (b) moving a flexible base on which an element is formed, and simultaneously feeding the protective sheet from the roll in a feed direction in such a manner that the feed direction coincides with the at least one direction, so as to stack the protective sheet on the base to cover the element. The protective sheet is the multilayer structure of the present invention.

Advantageous Effects of Invention

According to the present invention, a novel multilayer structure having highly reliable barrier properties can be obtained. The use of this multilayer structure to protect a device makes it possible to improve the durability of the device.

DESCRIPTION OF EMBODIMENTS

Hereinafter, embodiments of the present invention are described. In the following description, specific materials and numerical values may be mentioned as examples, but the present invention is not limited to such materials and numerical values. The materials mentioned below may be used alone, or two or more of them may be used in combination, unless otherwise stated. It should be noted that the term "gas barrier properties" in this description means the ability to act as a barrier against gases other than water vapor (for example, oxygen gas), unless otherwise stated. In this description, the water vapor barrier properties and the gas barrier properties may collectively be referred to as the "barrier properties".

[Multilayer Structure]

The multilayer structure of the present invention includes a substrate and a barrier layer stacked on the substrate. In this description, this substrate may be referred to as a "substrate (X)". The barrier layer also may be referred to as a "layer (Y)". The layer (Y) may be stacked on only one surface of the substrate (X), or the layers (Y) may be stacked on both surfaces of the substrate (X).

A light-transmitting protective sheet can be obtained by using a light-transmitting substrate and light-transmitting layers as the substrate (X) and the layers constituting the multilayer structure. The light-transmitting protective sheet is particularly suitable as a protective sheet for a surface of a device through which light needs to be transmitted. It should be noted that even a layer made of a highly light-absorbing material can have sufficient light transmission properties in some cases by reducing the thickness of the layer.

The multilayer structure of the present invention includes the substrate (X) and the layer (Y) stacked on the substrate (X). The layer (Y) contains a reaction product (R). The reaction product (R) is a reaction product formed by a reaction at least between a metal oxide (A) and a phosphorus compound (B). In an infrared absorption spectrum of the layer (Y) in a range of 800 to 1400 $cm^{-1}$, a wavenumber ($n^1$) at which maximum infrared absorption occurs is in a range of 1080 to 1130 $cm^{-1}$. Hereinafter, this wavenumber ($n^1$) may be referred to as a "maximum absorption wavenumber ($n^1$)". The metal oxide (A) normally reacts with the phosphorus compound (B) in the form of particles of the metal oxide (A).

In the present invention, a metal atom (M) constituting the metal oxide (A) is essentially an aluminum atom. As used herein, the phrase "being essentially an aluminum atom" means that the content of metal atoms other than aluminum atoms is low enough to neglect their influence on the properties of the layer (Y). The proportion of aluminum metal atoms in the metal atoms (M) constituting the metal oxide (A) is normally at least 90 mol %, and it is, for example, at least 95 mol %, at least 98 mol %, at least 99 mol %, or 100 mol %.

The layer (Y) has a structure in which particles of the metal oxide (A) are bonded to each other via a phosphorus atom derived from the phosphorus compound (B). Forms of bonding via a phosphorus atom include the form of bonding via an atomic group containing a phosphorus atom, and also include, for example, the form of bonding via a metal atom-free but phosphorus atom-containing atomic group.

In the layer (Y), the number of moles of metal atom that bonds the particles of the metal oxide (A) to each other and is not derived from the metal oxide (A) is preferably in the range of 0 to 1 times (for example, in the range of 0 to 0.9 times) the number of moles of phosphorus atom that bonds the particles of the metal oxide (A) to each other, and it may also be, for example, 0.3 times or less, 0.05 times or less, 0.01 times or less, or 0 times.

The layer (Y) included in the multilayer structure of the present invention may partially contain the metal oxide (A) and/or the phosphorus compound (B) that are not involved in the reaction.

Generally, when a metal compound reacts with a phosphorus compound, a bond represented by M-O—P in which a metal atom (M) constituting the metal compound and a phosphorus atom (P) derived from the phosphorus compound are bonded to each other via an oxygen atom (O) is formed, a characteristic peak appears in the infrared absorption spectrum. Here, this characteristic peak indicates an absorption peak that appears at a specific wavenumber, depending on the environment and structure around the bond. As disclosed in WO 2011/122036 A1, it was found that, when the absorption peak attributed to the M-O—P bond is in the range of 1080 to 1130 $cm^{-1}$, excellent barrier properties are exhibited in the resultant multilayer structure. In particular, it was found that, when this absorption peak appears as an absorption peak at the maximum absorption wavenumber in the region of 800 to 1400 $cm^{-1}$, where the absorptions attributed to the bonds between oxygen atoms and various atoms are generally observed, more excellent barrier properties are exhibited in the resultant multilayer structure.

Presumably, this is for the following reasons, although the present invention is not intended to be limited thereby in any way. When the particles of the metal oxide (A) are bonded to each other via a phosphorus atom derived from the phosphorus compound (B) without intermediation of a metal atom that is not derived from the metal oxide (A) so as to form a bond represented by M-O—P in which the metal atom (M) constituting the metal oxide (A) and the phosphorus atom (P) are bonded via an oxygen atom (O), the absorption peak attributed to the M-O—P bond appears in the range of 1080 to 1130 $cm^{-1}$ as an absorption peak at the maximum absorption wavenumber in the infrared absorption spectrum of the layer (Y) in the region of 800 to 1400 $cm^{-1}$, due to a relatively definite environment on the surface of the particles of the metal oxide (A).

In contrast, in the case where the phosphorus compound (B) and a metal compound which does not form a metal oxide such as a metal alkoxide or a metal salt, are previously mixed together and subjected to hydrolysis condensation, a composite in which metal atoms derived from the metal compound and phosphorus atoms derived from the phosphorus compound (B) are almost homogeneously mixed and reacted is obtained, and the maximum absorption wavenumber ($n^1$) in the infrared absorption spectrum in the range of 800 to 1400 $cm^{-1}$ is located outside the range of 1080 to 1130 $cm^{-1}$.

In order to impart further excellent barrier properties to the multilayer structure, the above-mentioned maximum absorption wavenumber ($n^1$) is preferably in the range of 1085 to 1120 $cm^{-1}$, and more preferably in the range of 1090 to 1110 $cm^{-1}$.

In the infrared absorption spectrum of the layer (Y), absorptions due to stretching vibration of hydroxyl groups bonded to various atoms may be observed in the range of 2500 to 4000 $cm^{-1}$. Examples of the hydroxyl group that has an absorption in this range include a hydroxyl group, in the form of M-OH, present on the surface of the portion of the metal oxide (A), a hydroxyl group, in the form of P—OH, bonded to the phosphorus atom (P) derived from the phosphorus compound (B), and a hydroxyl group, in the form of C—OH, derived from a polymer (C) to be described later. The amount of hydroxyl group present in the layer (Y) can be associated with the absorbance ($A^2$) at a wavenumber ($n^2$) of the maximum absorption due to stretching vibration of hydroxyl group in the range of 2500 to 4000 $cm^{-1}$. Here, the wavenumber ($n^2$) is a wavenumber at which maximum infrared absorption due to stretching vibration of hydroxyl group occurs in the infrared absorption spectrum of the layer (Y) in the range of 2500 to 4000 $cm^{-1}$. Hereinafter, the wavenumber ($n^2$) may be referred to as the "maximum absorption wavenumber ($n^2$)".

The more the amount of hydroxyl group present in the layer (Y) is, the more the water vapor barrier properties tend to deteriorate due to the hydroxyl group serving as a permeation pathway for water molecules. In addition, it is thought that, in the infrared absorption spectrum of the layer (Y), the smaller the ratio of the absorbance ($A^1$) at the above-mentioned maximum absorption wavenumber ($n^1$) and the above-mentioned absorbance ($A^2$) [Absorbance ($A^2$)/Absorbance ($A^1$)] is, the more effectively the particles of the metal oxide (A) are bonded to each other via a phosphorus atom derived from the phosphorus compound (B). Therefore, the ratio [Absorbance ($A^2$)/Absorbance ($A^1$)] is preferably 0.2 or less, and more preferably 0.1 or less, in order to allow the resultant multilayer structure to exhibit a high level of gas barrier properties and a high level of water vapor barrier properties. The multilayer structure in which the layer (Y) has such a ratio [Absorbance ($A^2$)/Absorbance ($A^1$)] as mentioned above can be obtained by adjusting the later-described ratio of the number of moles ($N_M$) of the metal atom constituting the metal oxide (A) and the number of moles ($N_P$) of the phosphorus atom derived from the phosphorus compound (B), heat treatment conditions, etc. In the infrared absorption spectrum of the later-described precursor layer of the layer (Y), a maximum absorbance ($A^{1'}$) in the range of 800 to 1400 $cm^{-1}$ and a maximum absorbance ($A^{2'}$) in the range of 2500 to 4000 $cm^{-1}$ due to stretching vibration of hydroxyl group may satisfy the relationship of Absorbance ($A^{2'}$)/Absorbance ($A^{1'}$)>0.2, which however is not particularly restrictive.

In the infrared absorption spectrum of the layer (Y), the half width of the absorption peak having a local maximum at the above-mentioned maximum absorption wavenumber ($n^1$) is preferably 200 $cm^{-1}$ or less, more preferably 150 $cm^{-1}$ or less, more preferably 130 $cm^{-1}$ or less, more preferably 110 $cm^{-1}$ or less, even more preferably 100 $cm^{-1}$ or less, and particularly preferably 50 $cm^{-1}$ or less, in view of the gas barrier properties and water vapor barrier properties of the resultant multilayer structure. Presumably, this is for the following reasons, although the present invention is not intended to be limited thereby in any way. When the particles of the metal oxide (A) are bonded to each other via a phosphorus atom, that is, when they are bonded to each other via a phosphorus atom derived from the phosphorus compound (B) without intermediation of a metal atom that is not derived from the metal oxide (A) to form a bond represented by M-O—P in which the metal atom (M) constituting the metal oxide (A) and the phosphorus atom (P) are bonded via an oxygen atom (O), the half width of the absorption peak having a local maximum at the maximum absorption wavenumber ($n^1$) falls within the above-mentioned range due to a relatively definite environment on the surface of the particles of the metal oxide (A). In this description, the half width of the absorption peak at the maximum absorption wavenumber ($n^1$) can be obtained by determining the wavenumbers at two points in the absorption peak where the absorbance at these points is half the absorbance ($A^1$) (Absorbance ($A^1$)/2) and by calculating the difference between the two wavenumbers.

The above-mentioned infrared absorption spectrum of the layer (Y) can be obtained through measurement by the ATR (attenuated total reflection) method, or the infrared absorption spectrum of a portion of the layer (Y) scraped from the multilayer structure can be measured by the KBr method.

In an example, the layer (Y) has a structure in which the particles of the metal oxide (A) are bonded to each other via a phosphorus atom derived from the phosphorus compound (B) without intermediation of a metal atom that is not derived from the metal oxide (A). This means that the particles of the metal oxide (A) are bonded to each other via a metal atom derived from the metal oxide (A) without intermediation of any other metal atom. As used herein, the "structure in which the particles of the metal oxide (A) are bonded to each other via a phosphorus atom derived from the phosphorus compound (B) without intermediation of a metal atom that is not derived from the metal oxide (A)" means a structure in which the main chain of the bond between the particles of the metal oxide (A) has a phosphorus atom derived from the phosphorus compound (B) but does not have any metal atom that is not derived from the metal oxide (A), which structure may include a structure in which the side chain of the bond has a metal atom. The layer (Y) may partially have a structure in which the particles of the metal oxide (A) are bonded to each other both via a phosphorus atom derived from the phosphorus compound (B) and via a metal atom (a structure in which the main chain of the bond between the particles of the metal oxide (A) to be bonded has both of a phosphorus atom derived from the phosphorus compound (B) and a metal atom).

In the layer (Y), examples of the bonding form between a phosphorus atom and each particle of the metal oxide (A) include a form of bonding in which a metal atom (M) constituting the metal oxide (A) and a phosphorus atom (P) are bonded via an oxygen atom (O). The particles of the metal oxide (A) may be bonded to each other via the phosphorus atom (P) derived from one molecule of the phosphorus compound (B), or may be bonded via the phosphorus atoms (P) derived from two or more molecules of the phosphorus compound (B). Specific examples of the bonding form between two particles of the metal oxide (A) include: the bonding form of (Mα)-O—P—O-(Mβ); the bonding form of (Mα)-O—P—[O—P]—O-(Mβ); the bonding form of (Mα)-O—P—Z—P—O-(Mβ); and the bonding form of (Mα)-O—P—Z—P—[O—P—Z—P]$_n$—O-(Mβ), where Mα represents the metal atom constituting one of the bonded particles of the metal oxide (A), and Mβ represents the metal atom constituting the other particle of the metal oxide (A). In the above-mentioned examples of the bonding form, n represents an integer of 1 or more, Z represents, when the phosphorus compound (B) has two or more phosphorus atoms in its molecule, a group of constituent atoms present between the two phosphorus atoms, and other substituents bonded to the phosphorus atoms are not described. In the layer (Y), one particle of the metal oxide (A) is preferably bonded to a plurality of other particles of the metal oxide (A), from the viewpoint of the barrier properties of the resultant multilayer structure.

[Metal Oxide (A)]

As described above, the metal atom (M) constituting the metal oxide (A) is essentially an aluminum atom. Examples of the metal atom (M) other than aluminum include: a metal of Group 2 of the periodic table, such as magnesium and calcium; a metal of Group 12 of the periodic table, such as zinc; a metal of Group 13 of the periodic table, except for aluminum; a metal of Group 14 of the periodic table, such as silicon; and a transition metal such as titanium and zirconium. Silicon may be classified into semimetal in some cases, but in this description, silicon is deemed to be included in metal. The metal atom (M) constituting the metal oxide (A) may be of one type or of two or more types. Among these, the metal atom (M) other than aluminum atom is preferably that of at least one selected from the group consisting of titanium and zirconium.

As the metal oxide (A), those produced by methods such as liquid-phase synthesis, gas-phase synthesis, and solid grinding can be used. Those produced by the liquid-phase synthesis are preferred in view of the production efficiency and the controllability of the shape and size of the resultant metal oxide (A).

In the liquid-phase synthesis, the metal oxide (A) can be synthesized as a hydrolyzed condensate of a compound (L) by using, as a raw material, the compound (L) containing the metal atom (M) to which a hydrolyzable characteristic group is bonded and subjecting the compound (L) to hydrolysis condensation. That is, the metal oxide (A) may be a hydrolyzed condensate of the compound (L). In producing the hydrolyzed condensate of the compound (L) by liquid-phase synthesis, not only the method using the compound (L) itself as a raw material but also the following methods can be used. Specifically, the metal oxide (A) can be produced by using a partial hydrolysate of the compound (L) obtained by partial hydrolysis of the compound (L), a total hydrolysate of the compound (L) obtained by total hydrolysis of the compound (L), a partially hydrolyzed condensate of the compound (L) obtained by partial hydrolysis condensation of the compound (L), a partial condensate of a total hydrolysate of the compound (L), or a mixture of two or more of them, as a raw material, and subjecting the raw material to condensation or hydrolysis condensation. The metal oxide (A) thus obtained is also referred to as the "hydrolyzed condensate of the compound (L)" in this description. The type of the above-mentioned hydrolyzable characteristic group (functional group) is not particularly limited. Examples thereof include a halogen atom (such as F, Cl, Br, or I), an alkoxy group, an acyloxy group, a diacylmethyl group, and a nitro group. A halogen atom or an alkoxy group is preferred, and an alkoxy group is more preferred, because of their excellent reaction controllability.

The compound (L) preferably contains at least one compound ($L^1$) represented by the following formula (I) for ease of the reaction control and excellent barrier properties of the resultant multilayer structure.

$$AlX^1_m R^1_{(3-m)} \quad (I)$$

In the formula (I): $X^1$ is selected from the group consisting of F, Cl, Br, I, $R^2O$—, $R^3C(=O)O$—, $(R^4C(=O))_2CH$— and $NO_3$; $R^1$, $R^2$, $R^3$, and $R^4$ each are selected from the group consisting of an alkyl group, an aralkyl group, an aryl group, and an alkenyl group; in the case where a plurality of $X^1$ are present in the formula (I), the plurality of $X^1$ may be the same as or different from each other; in the case where a plurality of $R^1$ are present in the formula (I), the plurality of $R^1$ may be the same as or different from each other; in the case where a plurality of $R^2$ are present in the formula (I), the plurality of $R^2$ may be the same as or different from each other; in the case where a plurality of $R^3$ are present in the formula (I), the plurality of $R^3$ may be the same as or different from each other; in the case where a plurality of $R^4$ are present in the formula (I), the plurality of $R^4$ may be the same as or different from each other; and m denotes an integer of 1 to 3.

Examples of the alkyl group denoted by $R^1$, $R^2$, $R^3$, and $R^4$ include a methyl group, an ethyl group, a normal propyl group, an isopropyl group, a normal butyl group, a s-butyl group, a t-butyl group, and a 2-ethylhexyl group. Examples of the aralkyl group denoted by $R^1$, $R^2$, $R^3$, and $R^4$ include a benzyl group, a phenethyl group, and a trityl group. Examples of the aryl group denoted by $R^1$, $R^2$, $R^3$, and $R^4$ include a phenyl group, a naphthyl group, a tolyl group, a xylyl group, and a mesityl group. Examples of the alkenyl group denoted by $R^1$, $R^2$, $R^3$, and $R^4$ include a vinyl group, and an allyl group. For example, $R^1$ is preferably an alkyl group having 1 to 10 carbon atoms, and more preferably an alkyl group having 1 to 4 carbon atoms. $X^1$ is preferably F, Cl, Br, I, or $R^2O$—. In one preferred example of the compound ($L^1$), $X^1$ is a halogen atom (F, Cl, Br, or I) or an alkoxy group ($R^2O$—) having 1 to 4 carbon atoms, and m is 3. In one example of the compound ($L^1$) $X^1$ is a halogen atom (F, Cl, Br, or I) or an alkoxy group ($R^2O$—) having 1 to 4 carbon atoms, and m is 3.

Specific examples of the compound ($L^1$) include aluminum compounds such as aluminum chloride, aluminum triethoxide, aluminum tri-normal propoxide, aluminum triisopropoxide, aluminum tri-normal butoxide, aluminum tri-s-butoxide, aluminum tri-t-butoxide, aluminum triacetate, aluminum acetylacetonate, and aluminum nitrate. Among these, the compound ($L^1$) is preferably at least one compound selected from aluminum triisopropoxide and aluminum tri-s-butoxide. One type of the compound ($L^1$) may be used alone, or two or more types thereof may be used in combination.

The compounds (L) other than the compound ($L^1$) are not particularly limited as long as the effects of the present invention are obtained, and examples thereof include compounds in which the above-mentioned hydrolyzable characteristic group is bonded to a metal atom such as titanium, zirconium, magnesium, calcium, zinc, or silicon. Silicon may be classified into semimetal in some cases, but in this description, silicon is deemed to be included in metal. Among these, the compounds (L) other than the compound ($L^1$) are preferably those containing titanium or zirconium as a metal atom because the resultant multilayer structure has excellent gas barrier properties. Specific examples of the compounds (L) other than the compound ($L^1$) include titanium compounds such as titanium tetraisopropoxide, titanium tetra-normal butoxide, titanium tetra(2-ethylhexoxide), titanium tetramethoxide, titanium tetraethoxide, and titanium acetylacetonate; and zirconium compounds such as zirconium tetra-normal propoxide, zirconium tetrabutoxide, and zirconium tetraacetylacetonate.

As long as the effects of the present invention are obtained, the proportion of the compound ($L^1$) in the compound (L) is not specifically limited. The proportion of a compound other than the compound ($L^1$) in the compound (L), for example, is 20 mol % or less, 10 mol % or less, 5 mol % or less, or 0 mol %. In one example, the compound (L) consists of the compound ($L^1$).

The hydrolysis of the compound (L) allows at least part of the hydrolyzable characteristic group in the compound (L) to be substituted by a hydroxyl group. The resultant hydrolysate is further condensed, thereby forming a compound in which the metal atom (M) is bonded via an oxygen atom (O). This condensation is repeated, as a result of which a compound that can be considered essentially as a metal oxide is formed. Usually, hydroxyl group is present on the surface of the metal oxide (A) thus formed. In this description, the hydrolyzed condensate of the compound (L) may be referred to as a "metal oxide (A)". That is, in this description, the "metal compound (A)" can read as the "hydrolyzed condensate of the compound (L)", and the "hydrolyzed condensate of the compound (L)" can read as the "metal oxide (A)".

In this description, a compound, in which the ratio of the number of moles of oxygen atom bonded only to the metal atom (M), as is an oxygen atom (O) in the structure represented by M-O-M (for example, an oxygen atom bonded to the metal atom (M) and a hydrogen atom (H), as the oxygen atom (O) in the structure represented by M—O—H, is excluded), with respect to the number of moles of metal atom (M) ([The number of moles of oxygen atom (O) bonded only to the metal atom (M)]/[The number of moles of metal atom (M)]) is at least 0.8, is deemed to be included in the metal oxide (A). In the metal oxide (A), the above-mentioned ratio is preferably at least 0.9, more preferably at least 1.0, and even more preferably at least 1.1. The upper limit of the above-mentioned ratio is not particularly limited, but is usually represented by n/2 when the valence of the metal atom (M) is n.

In order to cause the above-mentioned hydrolysis condensation to occur, it is important for the compound (L) to have a hydrolyzable characteristic group (functional group). When such a group is not bonded, hydrolysis condensation reaction does not occur or occurs very slowly, which makes it difficult to prepare the target metal oxide (A).

A hydrolyzed condensate can be produced, for example, from a specific raw material by a technique used in a known sol-gel method. As a raw material, at least one selected from the group consisting of the compound (L), a partial hydrolysate of the compound (L), a total hydrolysate of the compound (L), a partially hydrolyzed condensate of the compound (L), and a partial condensate of the total hydrolysate of the compound (L) (which hereinafter may be referred to as "compound (L)-based components") can be used. These raw materials may be produced by a known method, or commercially available ones may be used. Although the raw material is not particularly limited, a condensate obtained by hydrolysis condensation of about 2 to 10 molecules of the compound (L), for example, can be used as the raw material. Specifically, a dimer to decamer condensate obtained by hydrolysis condensation of aluminum triisopropoxide, for example, can be used as a part of the raw material.

The number of molecules to be condensed in the hydrolyzed condensate of the compound (L) can be controlled by the conditions for the condensation or hydrolysis condensation of the compound (L)-based component. For example, the number of molecules to be condensed can be controlled by the amount of water, the type or concentration of a catalyst, the temperature or duration of the condensation or hydrolysis condensation, etc.

As described above, the layer (Y) contains the reaction product (R), and the reaction product (R) is a reaction product formed by a reaction at least between the metal oxide (A) and the phosphorus compound (B). Such a reaction product and structure can be formed by mixing the metal oxide (A) and the phosphorus compound (B) to cause a reaction therebetween. The metal oxide (A) (immediately before being mixed) to be mixed with the phosphorus compound (B) may be the metal oxide (A) as it is, or may be in the form of a composition containing the metal oxide (A). In one preferred example, the metal oxide (A) in the form of a liquid (solution or dispersion) obtained by dissolving or dispersing the metal oxide (A) in a solvent is mixed with the phosphorus compound (B).

As the method for producing the solution or dispersion of the metal oxide (A), the method disclosed in WO 2011/122036 A1 can be used. In the case where the metal oxide (A) is aluminum oxide (alumina), a preferred alumina dispersion can be obtained by subjecting aluminum alkoxide to hydrolysis condensation in an aqueous solution whose pH has been adjusted with an acid catalyst, as needed, so as to form an alumina slurry and peptizing it in the presence of a specific amount of acid.

[Phosphorus Compound (B)]

The phosphorus compound (B) has a site capable of reacting with the metal oxide (A), and typically has a plurality of such sites. In one preferred example, the phosphorus compound (B) has 2 to 20 such sites (atomic groups or functional groups). Examples of such a site include a site capable of reacting with a functional group (for example, a hydroxyl group) present on the surface of the metal oxide (A). Examples of such a site include a halogen atom directly bonded to a phosphorus atom and an oxygen atom directly bonded to a phosphorus atom. Such halogen atom and oxygen atom can cause a condensation reaction (hydrolysis condensation reaction) with the hydroxyl group present on the surface of the metal oxide (A). The functional group (for example, a hydroxyl group) present on the surface of the metal oxide (A) is normally bonded to the metal atom (M) constituting the metal oxide (A).

As the phosphorus compound (B), one having a structure in which a halogen atom or an oxygen atom is directly bonded to a phosphorus atom, for example, can be used, and when the phosphorus compound (B) has such a structure, it can be bonded to the hydroxyl group present on the surface of the metal oxide (A) through (hydrolysis) condensation. The phosphorus compound (B) may have one phosphorus atom, or may have two or more phosphorus atoms.

The phosphorus compound (B) may be at least one compound selected from the group consisting of phosphoric acid, polyphosphoric acid, phosphorous acid, phosphonic acid, and a derivative thereof. Specific examples of polyphosphoric acid include pyrophosphoric acid, triphosphoric acid, and polyphosphoric acid in which four or more phosphoric acids are condensed. Examples of the derivative include a salt of phosphoric acid, polyphosphoric acid, phosphorous acid or phosphonic acid, a (partial) ester compound, a halide (chloride, etc.), and a dehydrate (diphosphorus pentaoxide, etc.). Examples of the derivative of phosphonic acid include, a compound in which a hydrogen atom directly bonded to a phosphorus atom of phosphonic acid ($H-P(=O)(OH)_2$) is substituted by an alkyl group that may have various functional groups (for example, nitrilotris (methylenephosphonic acid), and N,N,N',N'-ethylenediaminetetrakis(methylenephosphonic acid)), and the salt, a (partial) ester compound, a halide, and a dehydrate of the compound. Furthermore, an organic polymer having a phosphorus atom such as phosphorylated starch can also be used as the phosphorus compound (B). One type of the phosphorus compound (B) may be used alone, or two or more types thereof may be used in combination. Among these examples of the phosphorus compound (B), it is preferable to use phosphoric acid alone, or to use phosphoric acid and another phosphorus compound in combination, because the resultant multilayer structure has more excellent barrier properties and the later-described coating liquid (U) for use in forming the layer (Y) has more excellent stability.

As described above, the layer (Y) contains the reaction product (R), and the reaction product (R) is a reaction product formed by a reaction at least between the metal oxide (A) and the phosphorus compound (B). Such a reaction product and structure can be formed by mixing the metal oxide (A) and the phosphorus compound (B) to cause a reaction therebetween. The phosphorus compound (B) (immediately before being mixed) to be mixed with the metal oxide (A) may be the phosphorus compound (B) as it is, or may be in the form of a composition containing the phosphorus compound (B), and is preferably in the form of a composition containing the phosphorus compound (B). In one preferred example, the phosphorus compound (B), in the form of a solution obtained by dissolving the phosphorus compound (B) in a solvent, is mixed with the metal oxide (A). In this case, any arbitrary solvent can be used, but water or a mixed solvent containing water can be mentioned as a preferred solvent.

[Reaction Product (R)]

The reaction product (R) includes a reaction product produced by a reaction between only the metal oxide (A) and the phosphorus compound (B). The reaction product (R) also includes a reaction product produced by a reaction of the metal oxide (A), the phosphorus compound (B), and another compound, in addition. The reaction product (R) can be formed by a method described in the later-described production method.

[Ratio of Metal Oxide (A) and Phosphorus Compound (B)]

In the layer (Y), the ratio of the number of moles ($N_M$) of the metal atom (M) constituting the metal oxide (A) and the number of moles ($N_P$) of the phosphorus atom derived from the phosphorus compound (B) preferably satisfies the relationship of 0.8≤Number of moles ($N_M$)/Number of moles ($N_P$)≤4.5, more preferably satisfies the relationship of 1.0≤Number of moles ($N_M$)/Number of moles ($N_P$)≤3.6, even more preferably satisfies the relationship of 1.1≤Number of moles ($N_M$)/Number of moles ($N_P$)≤3.0. When the value of Number of moles ($N_M$)/Number of moles ($N_P$) exceeds 4.5, the metal oxide (A) becomes excessive relative to the phosphorus compound (B) and thus the particles of the metal oxide (A) are insufficiently bonded, while the amount of hydroxyl group present on the surface of the metal oxide (A) increases, and thereby the barrier properties and their reliability tend to deteriorate. On the other hand, when the value of Number of moles (NO/Number of moles ($N_P$) is less than 0.8, the phosphorus compound (B) becomes excessive relative to the metal oxide (A) and thus the excess of the phosphorus compound (B) that is not involved in the bond with the metal oxide (A) increases, while the amount of hydroxyl group derived from the phosphorus compound (B) is likely to increase, and thereby the barrier properties and their reliability also tend to deteriorate.

The above-mentioned ratio can be adjusted by the ratio of the amount of the metal oxide (A) and the amount of the phosphorus compound (B) in the coating liquid for use in forming the layer (Y). The ratio of the number of moles ($N_M$) and the number of moles ($N_P$) in the layer (Y) is usually a ratio in the coating liquid, and the same as the ratio of the number of moles of metal atom constituting the metal oxide (A) and the number of moles of phosphorus atom constituting the phosphorus compound (B).

<Polymer (C)>

The layer (Y) may further contain a specific polymer (C). The polymer (C) is a polymer having at least one functional group (f) selected from the group consisting of a hydroxyl group, a carboxyl group, a carboxylic anhydride group, and a salt of a carboxyl group. In this description, a polymer that satisfies the requirements as the phosphorus compound (B) and has the functional group (f) is not included in the polymer (C) and treated as the phosphorus compound (B).

Specific examples of the polymer (C) having a hydroxyl group include poly(vinyl alcohol), a partially saponified product of poly(vinyl acetate), poly(ethylene glycol), poly (hydroxyethyl (meth)acrylate), polysaccharide such as starch, and a polysaccharide derivative derived from polysaccharide. Specific examples of the polymer (C) having a carboxyl group, a carboxylic anhydride group, or a salt of a carboxyl group include poly(acrylic acid), poly(methacrylic acid), poly(acrylic acid/methacrylic acid), and the salt thereof. Specific examples of the polymer (C) containing a constitutional unit free from the functional group (0 include ethylene-vinyl alcohol copolymer, ethylene-maleic anhydride copolymer, styrene-maleic anhydride copolymer, isobutylene-maleic anhydride alternating copolymer, ethylene-acrylic acid copolymer, and a saponified product of ethylene-ethyl acrylate copolymer. In order to obtain a multilayer structure with more excellent barrier properties and hot-water resistance, the polymer (C) is preferably at least one polymer selected from the group consisting of poly(vinyl alcohol), ethylene-vinyl alcohol copolymer, polysaccharide, poly(acrylic acid), a salt of poly(acrylic acid), poly(methacrylic acid), and a salt of poly(methacrylic acid).

The molecular weight of the polymer (C) is not particularly limited. In order to obtain a multilayer structure with more excellent barrier properties and mechanical properties (such as drop impact strength), the number average molecular weight of the polymer (C) is preferably at least 5,000, more preferably at least 8,000, and even more preferably at least 10,000. The upper limit of the number average molecular weight of the polymer (C) is not particularly limited, and it is, for example, is 1,500,000 or less.

In order to further improve the barrier properties, the content of the polymer (C) in the layer (Y) is preferably 50 mass % or less, more preferably 40 mass % or less, and even more preferably 30 mass % or less, and may be 20 mass % or less, with respect to the mass of the layer (Y) (defined as 100 mass %). The polymer (C) may or may not react with another component in the layer (Y). In this description, the polymer (C) having reacted with another component is also referred to as the polymer (C). For example, the polymer (C) bonded to the metal oxide (A) and/or a phosphorus atom derived from the phosphorus compound (B) is also referred to as the polymer (C). In this case, the above-mentioned content of the polymer (C) is calculated by dividing the mass of the polymer (C) before being bonded to the metal oxide (A) and/or the phosphorus atom by the mass of the layer (Y).

The layer (Y) may consist of the reaction product (R) (which includes a reaction product having a polymer (C) portion) formed by a reaction at least between the metal oxide (A) and the phosphorus compound (B), or may consist of the unreacted polymer (C) and the reaction product (R), and may also contain other components additionally.

Examples of the above-mentioned other components include a metal salt of an inorganic acid such as carbonate, hydrochloride, nitrate, hydrogencarbonate, sulfate, hydrogensulfate, borate, and aluminate; a metal salt of an organic acid such as oxalate, acetate, tartrate, and stearate; a metal complex such as an acetylacetonate metal complex (such as an aluminum acetylacetonate), a cyclopentadienyl metal complex (such as titanocene), and a cyano metal complex; a layered clay compound; a crosslinking agent; a polymeric compound other than the polymer (C); a plasticizer; an antioxidant; an ultraviolet absorber; and a flame retardant.

The content of the above-mentioned other components in the layer (Y) is preferably 50 mass % or less, more preferably 20 mass % or less, even more preferably 10 mass % or less, and particularly preferably 5 mass % or less, and may be 0 mass % (free from such other components).

[Thickness of the Layer (Y)]

The thickness of the layer (Y) included in the multilayer structure of the present invention (or the total thickness of the layers (Y) when the multilayer structure has two or more layers (Y)) is preferably 4.0 μm or less, more preferably 2.0 μm or less, even more preferably 1.0 μm or less, and particularly preferably 0.9 μm or less. When the layer (Y) is thin, the dimensional change of the multilayer structure can be kept small during processing such as printing and lamination, and the flexibility of the multilayer structure is increased. Thus, it is possible to obtain the multilayer structure having the mechanical properties similar to the original mechanical properties of the substrate itself.

The thickness of the layer (Y) (or the total thickness of the layers (Y) when the multilayer structure has two or more layers (Y)) is preferably at least 0.1 μm (for example, at least 0.2 μm). The thickness of each layer (Y) is preferably at least 0.05 μm (for example, at least 0.15 μm) for better barrier properties of the multilayer structure of the present invention. The thickness of the layer (Y) can be controlled by the concentration of the later-described coating liquid (U) for use in forming the layer (Y) and the method for applying the coating liquid (U).

The barrier properties of the multilayer structure of the present invention can be enhanced because a specific substrate (X) is used therein. Specifically, the multilayer structure can have a vapor transmission rate of 0.05 g/(m²·day) or less, 0.01 g/(m²·day) or less, or even 0.005 g/(m²·day) or less under the conditions of 40° C. and 90/0% RH. In the case where the multilayer structure is used as a protective sheet for a device (for example, a solar cell), the vapor transmission rate under the above conditions is preferably 0.1 g/(m²·day) or less, more preferably 0.01 g/(m²·day) or less, and even more preferably 0.005 g/(m²·day) or less. As used herein, "90/0% RH" means that, with respect to the multilayer structure, the relative humidity on one side of the multilayer structure is 90% and the relative humidity on the other side is 0%.

The oxygen transmission rate under the conditions of 20° C. and 85% RH is preferably 0.5 ml/(m²·day·atm) or less, more preferably 0.3 ml/(m²·day·atm) or less, and even more preferably 0.1 ml/(m²·day·atm) or less.

[Substrate (X)]

The substrate (X) is a substrate in the form of a layer-like film or the like. As the substrate (X), a substrate whose 3% strain tension in at least one direction is at least 2000 N/m is used. As used herein, the "3% strain tension" means the tensile stress applied to a substrate having a unit length (of 1 m) measured in a certain direction when the substrate is stretched in a direction perpendicular to the certain direction by 3% under the conditions of 23° C. and 50% RH. Specifically, the 3% strain tension can be obtained by the measurement method used in Examples below. The 3% strain tension of the substrate (X) in at least one direction is preferably at least 2500 N/m, and more preferably at least 3000 N/m (for example, at least 3600 N/m). Although the upper limit of the 3% strain tension of the substrate (X) is not particularly limited, it is usually 30000 N/m or less.

In one typical example, the "at least one direction" refers to the MD (machine direction) in the production of a substrate. As used herein, the MD refers to the direction in which the substrate or the precursor thereof is fed to be processed (for the production or the like) while being fed, and corresponds to the longitudinal direction of the produced long substrate before being cut. The 3% strain tension of the substrate (X) in all directions may be at least 2000 N/m, or the 3% strain tension in all directions may be in the above-mentioned preferred range.

Hereinafter, the direction in which the 3% strain tension is at least 2000 N/m may be referred to as the "direction (D)". When the multilayer structure of the present invention is used as a protective sheet for a device, it is usually necessary to stack the multilayer structure, which is under tension in a predetermined direction, on the device. Even in such a case, deterioration of the barrier properties of the barrier layer can be suppressed by performing the stacking under tension in the direction (D). In particular, in the case where the multilayer structure (protective sheet) is stacked on the device by the roll-to-roll process, the multilayer structure under tension in the feed direction (MD) is usually stacked on the device. Even in such a case, deterioration of the performance of the barrier layer can be suppressed by performing the stacking in such a manner that the feed direction coincides with the direction (D) during the stacking.

The material of the substrate (X) is not particularly limited as long as its 3% strain tension in the direction (D) meets the above-described requirements, and various materials can be used for the substrate. Examples of the material for the substrate (X) include thermoplastic resins having light transmission properties. Specific examples thereof include poly(ethylene terephthalate) (PET), polycarbonate (PC), poly(methyl methacrylate), polystyrene, poly(methyl methacrylate/styrene) copolymer, syndiotactic polystyrene, cyclic polyolefin, cyclic olefin copolymer (COC), polyacetyl cellulose, polyimide, polypropylene, polyethylene, poly(ethylene naphthalate), polyvinyl acetal, polyvinyl butyral, poly(vinyl alcohol), poly(vinyl chloride), and polymethylpentene. Among these, poly(ethylene terephthalate)(PET), poly(ethylene naphthalate) (PEN), polycarbonate (PC), and cyclic olefin copolymer (COC) are preferred because they have excellent heat resistance as well as high transparency. The substrate (X) may be composed of two or more resins. The substrate (X) may be a multilayer film composed of two or more layers. The substrate (X) may be a multilayer film composed of two or more layers including an adhesive layer interposed therebetween.

The 3% strain tension of the substrate in the direction (D) varies depending on the material and thickness of the substrate, whether the substrate contains an additive, and whether the substrate has been stretched. Therefore, it is possible to increase the 3% strain tension of the substrate by using a material having a high tensile modulus, increasing the thickness, compounding a metal or an inorganic substance, or performing stretching.

The thermoplastic resin film may be a stretched film or may be an unstretched film. The thermoplastic resin film is preferably a stretched film, particularly a biaxially stretched film, because the resultant multilayer structure has excellent processability (e.g., in printing or lamination). The biaxially stretched film may be a biaxially stretched film produced by any of simultaneous biaxial stretching, sequential biaxial stretching, and tubular stretching.

The thickness of the substrate (X) is not limited, and it may be, for example, in the range of 10 μm to 300 μm, or in the range of 20 μm to 200 μm. However, if the substrate (X) is too thick, the substrate (X) absorbs too much light or the flexibility of the multilayer structure decreases. Therefore, generally, the thickness of the substrate (X) is preferably 150 μm or less.

[Adhesive Agent Layer (H)]

In the multilayer structure of the present invention, the layer (Y) may be stacked in direct contact with the substrate (X), or the layer (Y) may be stacked on the substrate (X) with an adhesive agent layer (H) interposed between the substrate (X) and the layer (Y). This structure may enhance the adhesion between the substrate (X) and the layer (Y) in some cases. The adhesive agent layer (H) may be formed of an adhesive resin. The adhesive agent layer (H) made of an adhesive resin can be formed by treating the surface of the substrate (X) with a known anchor coating agent, or applying a known adhesive agent onto the surface of the substrate (X). As the adhesive agent, for example, a two-component reactive polyurethane adhesive agent containing a polyisocyanate component and a polyol component to be mixed and reacted is preferred. It may sometimes be possible to further enhance the adhesion by adding a small amount of additive such as a known silane coupling agent to the anchor coating agent or the adhesive agent. Preferred examples of the silane coupling agent include silane coupling agents having reactive groups such as an isocyanate group, an epoxy group, an amino group, an ureide group, and a mercapto group. Strong adhesion between the substrate (X) and the layer (Y) with the adhesive agent layer (H) interposed therebetween makes it possible to more effectively suppress deterioration of the barrier properties and appearance of the multilayer structure of the present invention when the multilayer structure is subjected to processing such as printing and lamination.

It is possible to enhance the strength of the multilayer structure of the present invention by increasing the thickness of the adhesive agent layer (H). However, when the thickness of the adhesive agent layer (H) is increased excessively, the appearance tends to deteriorate. The thickness of the adhesive agent layer (H) is preferably in the range of 0.01 to 1 µm, and more preferably in the range of 0.03 to 0.5 µm. The thickness is preferably in the range of 0.03 to 0.18 µm, more preferably in the range of 0.04 to 0.14 µm, and even more preferably in the range of 0.05 to 0.10 µm.

[Configuration of Multilayer Structure]

The multilayer structure (layered body) of the present invention may consist of the substrate (X) and the layer (Y), or may consist of the substrate (X), the layer (Y), and the adhesive agent layer (H). The multilayer structure of the present invention may include a plurality of layers (Y). The multilayer structure of the present invention may further include one or more layers other than the substrate (X), the layer (Y), and the adhesive agent layer (H) (for example, an additional layer such as a thermoplastic resin film layer and an deposited inorganic layer). The multilayer structure of the present invention having such another member (an additional layer, etc.) can be produced by stacking the layer (Y) onto the substrate (X) directly or with the adhesive agent layer (H) interposed therbetween and then forming or bonding the other member (an additional layer, etc.) onto the stack directly or with an adhesive layer interposed therebetween. The properties of the multilayer structure can be improved, or new properties can be imparted thereto, by adding such another member (an additional layer, etc.) to the multilayer structure. For example, heat-sealing properties can be imparted to the multilayer structure of the present invention, or the barrier properties and mechanical properties thereof can be further improved.

The deposited inorganic layer preferably has barrier properties against oxygen gas and water vapor. The deposited inorganic layer can be formed by depositing an inorganic substance on the substrate (X). Examples of the deposited inorganic layer include: a layer formed of an inorganic oxide such as aluminum oxide, silicon oxide, silicon oxynitride, magnesium oxide, tin oxide, or a mixture thereof, a layer formed of an inorganic nitride such as silicon nitride or silicon carbonitride; a layer formed of an inorganic carbide such as silicon carbide; and a layer formed of a metal such as aluminum, silver, silicon, zinc, tin, titanium, tantalum, niobium, ruthenium, gallium, platinum, vanadium, or indium. Among these, layers formed of aluminum oxide, silicon oxide, magnesium oxide, silicon nitride, zinc oxide, and titanium oxide are preferred because they have excellent barrier properties against oxygen gas and water vapor.

The preferred thickness of the deposited inorganic layer varies depending on the type of the components of the deposited inorganic layer, but it is usually in the range of 2 to 500 nm. The thickness that allows the multilayer structure to have good barrier properties and mechanical properties can be selected from thicknesses in this range. If the thickness of the deposited inorganic layer is less than 2 nm, the deposited inorganic layer tends to have reduced reproducibility in exhibiting the barrier properties against oxygen gas and water vapor, or the deposited inorganic layer may fail to exhibit sufficient barrier properties in some cases. If the thickness of the deposited inorganic layer exceeds 500 nm, the deposited inorganic layer tends to have reduced barrier properties when the multilayer structure is stretched or bent. The thickness of the deposited inorganic layer is more preferably in the range of 5 to 200 nm, and even more preferably in the range of 10 to 100 nm.

Examples of the method for forming the deposited inorganic layer include vacuum deposition, sputtering, ion plating, chemical vapor deposition (CVD), etc. Among these, vacuum deposition is preferred from the viewpoint of productivity. A heating technique used for vacuum deposition is preferably any of electron beam heating, resistance heating, and induction heating. In order to improve the adhesion to the substrate on which the deposited inorganic layer is formed and the denseness of the deposited inorganic layer, plasma-assisted deposition or ion beam-assisted deposition may be employed for the deposition. In order to enhance the transparency of the transparent deposited inorganic layer, reactive deposition in which a reaction is caused by injecting oxygen gas or the like may be employed for the deposition.

The multilayer structure of the present invention may include two or more layers (Y), and the layers (Y) may be stacked on one principal surface of the substrate (X) and the other principal surface thereof respectively, that is, on both surfaces of the substrate (X).

The multilayer structure of the present invention may include a surface protective layer (or surface protective layers) disposed on one or both surfaces of the multilayer structure. A layer made of a scratch-resistant resin is preferred as the surface protective layer. The surface protective layer of a device such as a solar cell which may be used outdoors is preferably made of a resin having high weather resistance (for example, light resistance). In the case of protecting a surface through which light needs to be transmitted, the surface protective layer preferably has high light transmission properties. Examples of the material of the surface protective layer (surface protective film) include acrylic resin, polycarbonate, poly(ethylene terephthalate), poly(ethylene naphthalate), ethylene-tetrafluoroethylene copolymer, polytetrafluoroethylene, tetrafluoroethylene-perchloroalkoxy copolymer, tetrafluoroethylene-hexafluoropropylene copolymer, diethylene-tetrafluoroethylene copolymer, polychlorotrifluoroethylene, polyvinylidene fluoride, and poly(vinyl fluoride). In an example, the multilayer structure includes an acrylic resin layer disposed on one surface thereof. Any of various additives (for example, an ultraviolet absorber) may be added to the surface protective layer in order to enhance the durability of the surface protective layer. A preferred example of the surface protective layer having high weather resistance is an acrylic resin layer containing an ultraviolet absorber added thereto. Examples of the ultraviolet absorber include known ultraviolet absorbers, and include, for example, benzotriazole-based, benzophenone-based, salicylate-based, cyanoacrylate-based, nickel-based, and triazine-based ultraviolet absorbers. Furthermore, a stabilizer, a light stabilizer, an antioxidant, or the like, may be additionally used.

The surface protective layer is stacked on a multilayer structure (which may be referred to as a "barrier film" hereinafter) including the substrate and the barrier layer. The method for stacking the surface protective layer on the barrier film is not limited. For example, the surface protective layer and the barrier film may be bonded together using an adhesive layer. The adhesive layer can be selected according to the type of the surface protective layer. For example, in the case where the surface protective layer is an acrylic resin film, polyvinyl acetal (for example, polyvinyl butyral) may be used for the adhesive layer. A multilayer film composed of an acrylic resin and polyvinyl acetal also can be used as the surface protective layer. In this case, the above-described surface protective layer or the multilayer structure or film including the above-described protective layer can be heat-laminated on the barrier film with the adhesive layer interposed therebetween.

Polyvinyl acetal is synthesized by reacting poly(vinyl alcohol) and an aldehyde compound by a known method. The aldehyde compound that is reacted with poly(vinyl alcohol) is preferably an aldehyde compound having 2 to 6 carbon atoms, and more preferably a linear or branched saturated aliphatic aldehyde, such as acetaldehyde, propionaldehyde, n-butyraldehyde, or isobutyraldehyde. Among these, it is even more preferable to use at least one selected from the group consisting of acetaldehyde and n-butyraldehyde.

The average degree of polymerization of polyvinyl acetal is defined as being equal to the viscosity-average degree of polymerization of polyvinyl alcohol to be acetalized. The average degree of polymerization of polyvinyl acetal (or poly(vinyl alcohol)) is preferably in the range of 500 or more and 2000 or less, more preferably in the range of 700 or more and 1700 or less, and even more preferably in the range of 800 or more and 1500 or less. If the degree of polymerization of poly(vinyl alcohol) is less than 500, the mechanical properties of the resultant polyvinyl acetal resin formed body are insufficient and thus stable forming cannot be performed. On the other hand, if the degree of polymerization of poly(vinyl alcohol) exceeds 2000, the melt viscosity of the resultant polyvinyl acetal resin is too high for hot forming and thus it is difficult to produce a formed body of the resin. The degree of polymerization of poly(vinyl alcohol) is measured according to JIS K 6726.

The proportion of acetic acid in polyvinyl acetal is measured, for example, by the method for vinyl butyral in polyvinyl butyral in JIS K6728-1977 or by $^1$H-NMR obtained by using a nuclear magnetic resonance apparatus. The proportion of acetic acid in polyvinyl acetal is preferably 5 mass % or less, more preferably 3 mass % or less, and even more preferably 2 mass % or less. If the amount of the residual acetic acid groups exceeds 5 mass %, the heat resistance is not sufficient, and it may be difficult to perform stable melt forming due to thermal decomposition and crosslinking gelation.

The content of acetal in polyvinyl acetal is measured, for example, by the method for vinyl butyral in polyvinyl butyral in JIS K6728-1977. The content of vinyl acetal in polyvinyl acetal is preferably 55 to 85 mass %, and more preferably 60 to 80 mass %. If the content of vinyl acetal in the polyvinyl acetal is less than 55 mass %, its thermal stability is not sufficient and its melt processability is poor. On the other hand, if the degree of acetalization of the polyvinyl acetal exceeds 85 mass %, its acetalization reaction takes a long time and thus its production cost is high.

The polyvinyl acetal used in the present invention may be synthesized by reacting an aldehyde compound having 4 or more carbon atoms, an aldehyde compound having 3 or less carbon atoms, and poly(vinyl alcohol), from the viewpoints of adhesion to a methacrylic resin and heat resistance. The molar ratio of the vinyl acetal units acetalized with the aldehyde compound having 4 or more carbon atoms to the vinyl acetal units acetalized with the aldehyde compound having 3 or less carbon atoms is preferably 90/10 to 1/99, and more preferably 80/20 to 1/99. The molar ratio of the vinyl acetal units can be determined, for example, by $^1$H-NMR. The use of such polyvinyl acetal can provide a sheet having excellent adhesion to a methacrylic resin and heat resistance in addition to excellent strength/elastic modulus, surface hardness, surface smoothness, and transparency.

Preferred examples of the structure of the multilayer structure of the present invention are shown below, but the structure of the multilayer structure of the present invention is not limited to these examples. It should be noted that, although the multilayer structure may have the adhesive agent layer (H) between the substrate and the barrier layer, the adhesive agent layer (H) is not described in the specific examples below.

(1) Barrier layer/Substrate/Barrier layer
(2) Substrate/Barrier layer/Adhesive layer/Surface protective layer
(3) Barrier layer/Substrate/Barrier layer/Adhesive layer/Surface protective layer
(4) Deposited inorganic layer/Substrate/Barrier layer
(5) Deposited inorganic layer/Barrier layer/Substrate
(6) Deposited inorganic layer/Barrier layer/Substrate/Barrier layer
(7) Deposited inorganic layer/Barrier layer/Substrate/Barrier layer/Deposited inorganic layer
(8) Barrier layer/Deposited inorganic layer/Substrate
(9) Barrier layer/Deposited inorganic layer/Substrate/Barrier layer
(10) Barrier layer/Deposited inorganic layer/Substrate/Deposited inorganic layer/Barrier layer
(11) Barrier layer/Deposited inorganic layer/Substrate/Barrier layer/Deposited inorganic layer In one preferred example in the above structure examples (1) to (11), the substrate is a poly(ethylene terephthalate) film or a polycarbonate film. In one preferred example in the above structure examples (2) and (3), the adhesive layer is a polyvinyl acetal (for example, polyvinyl butyral) layer and the surface protective layer is an acrylic resin layer. In another preferred example in the above structure examples (2) and (3), the adhesive layer is a layer made of a two-component reactive polyurethane adhesive agent and the surface protective layer is an ethylene-tetrafluoroethylene copolymer layer or an acrylic resin layer. The above structures (2) and (3) are preferred as protective sheets for solar cells.

[Protective Sheet and Device Using the Sheet]

The multilayer structure of the present invention has both excellent gas barrier properties and excellent water vapor barrier properties. Furthermore, according to the present invention, it is possible to obtain a multilayer structure having excellent light transmission properties. Therefore, the multilayer structure of the present invention can be used as a protective sheet for various devices, and can be preferably used as a protective sheet for protecting the surface through which light needs to be transmitted. In addition, since the multilayer structure of the present invention can be made flexible, it can be particularly preferably used as a protective sheet for flexible devices. In this description, examples of the "flexible body" include bodies having flexibility enough to be wound on the curved surface of a cylinder with a diameter of 30 cm without any difficulty, and include bodies having flexibility enough to be wound on the curved surface of a cylinder with a diameter of 15 cm, for example, without any difficulty.

The device of the present invention is a device including a protective sheet for protecting the surface of the device, and this protective sheet is the multilayer structure of the present invention. Examples of the device include solar cells, displays, and lighting devices. Examples of displays include electronic paper, liquid crystal displays, and organic EL displays. Examples of lighting devices include organic EL lighting devices. Since the multilayer structure of the present invention is a light-transmitting multilayer structure, it is preferably used as a protective sheet for a surface through which light needs to be transmitted. For example, the multilayer structure can be used as a sheet for protecting the light incident surface of a solar cell, the display surface of a display, or the light emitting surface of a lighting device. The device of the present invention may be a flexible device. The configuration of a part of the device other than the protective sheet is not limited, and the configuration of any known device can be applied thereto.

The multilayer structure of the present invention can be used instead of a glass for protecting the surface of the device. This means that the use of the multilayer structure of the present invention can avoid the use of a thick and substantially not flexible glass base. However, the multilayer structure of the present invention may be used in a device including a thick glass base.

As described above, the protective sheet (the multilayer structure of the present invention) for protecting the device may further include a protective layer for protecting the surface of the device. Since this protective layer is described above, the same description is not repeated. In the case where the protective sheet includes the surface protective layer, the barrier film and the surface protective layer are disposed on the device in this order.

The device of the present invention is obtained by fixing the multilayer structure of the present invention (protective sheet) to the surface of the device to be protected. The method for fixing the protective sheet is not particularly limited. The protective sheet may be fixed by a known method. For example, an adhesive layer such as an OCA (optically clear adhesive) layer may be used to fix (bond) the protective sheet, or a sealing agent may be used to fix it. Specifically, another adhesive layer than the protective sheet may be used for stacking, or the protective sheet including an adhesive layer may be used for stacking. The adhesive layer is not particularly limited, and a known adhesive layer or adhesive agent, or any of the above-mentioned adhesive layers (such as an adhesive agent layer) or adhesive agents may be used. Examples of the adhesive layer include a film serving as an adhesive layer. For example, ethylene-vinyl acetate resin (which may hereinafter be abbreviated as "EVA"), polyvinyl butyral, ionomer, etc. can be mentioned, and a polyethylene terephthalate film with improved adhesion to EVA may be used in the multilayer structure.

The solar cell in which the protective sheet of the present invention is used is not particularly limited. Examples of the solar cell include a silicon solar cell, a compound semiconductor solar cell, and an organic solar cell. Examples of the silicon solar cell include a monocrystalline silicon solar cell, a polycrystalline silicon solar cell, and an amorphous silicon solar cell. Examples of the compound semiconductor solar cell include a III-V Group compound semiconductor solar cell, a II-VI Group compound semiconductor solar cell, and a I-III-VI Group compound semiconductor solar cell. The solar cell may or may not be a solar cell assembly including a plurality of unit cells that are connected in series.

Some types of solar cell can be formed by the so-called roll-to-roll process. In the roll-to-roll process, a flexible base (e.g., a stainless steel base or a resin base) wound on a feed roll is fed to form solar cell elements on the base, and then the base on which the solar cell elements have been formed is wound on a wound-up roll. Since the protective sheet of the present invention can be formed in the form of a flexible long sheet, it can be suitably used as a protective sheet for solar cells formed by the roll-to-roll process. For example, a roll of the protective sheet of the present invention may be prepared. After solar cell elements are formed on a base by the roll-to-roll process, the protective sheet is stacked on the solar cell elements before the base is wound on a wound-up roll. Alternatively, a solar cell formed by the roll-to-roll process and wound on a roll and the protective sheet wound on a roll may be stacked together. The same applies to other devices formed by the roll-to-roll process.

[Method for Producing Multilayer Structure]

Hereinafter, an example of the method for producing the multilayer structure of the present invention is described. According to this method, it is possible to easily produce the multilayer structure of the present invention. The materials used in the method for producing the multilayer structure of the present invention, the structure of the multilayer structure, etc. are the same as those described above. Therefore, the same description may not be repeated in some cases. For example, the description on the metal oxide (A), the phosphorus compound (B), and the polymer (C) for use in the multilayer structure of the present invention can be applied to this method. What is described for this production method can be applied to the multilayer structure of the present invention. Likewise, what is described for the multilayer structure of the present invention can be applied to the production method of the present invention. As the method for forming the layer (Y), the method disclosed in WO 2011/122036 A1 can be employed.

This example method includes steps (I), (II), and (III). In the step (I), a metal oxide (A), at least one compound having a site capable of reacting with the metal oxide (A), and a solvent are mixed so as to prepare a coating liquid (U) containing the metal oxide (A), the at least one compound, and the solvent. In the step (II), the coating liquid (U) is applied onto the substrate (X) so as to form a precursor layer of the layer (Y) on the substrate (X). In step (III), the precursor layer is treated so as to form the layer (Y).

[Step (I)]

The at least one compound having a site capable of reacting with the metal oxide (A) and used in the step (I) includes a phosphorus compound (B). Preferably, the number of moles of metal atom contained in the at least one compound is in the range of 0 to 1 times the number of moles of phosphorus atom contained in the phosphorus compound (B). A multilayer structure with more excellent barrier properties can be obtained by adjusting the ratio of (Number of moles of metal atom contained in the at least one compound)/(Number of moles of phosphorus atom contained in the phosphorus compound (B)) in the range of 0 to 1 (for example, in the range of 0 to 0.9). This ratio is preferably 0.3 or less, more preferably 0.05 or less, even more preferably 0.01 or less, or may be 0, in order to further improve the barrier properties of the multilayer structure. Typically, the at least one compound consists of the phosphorus compound (B).

The step (I) preferably includes the following steps (Ia) to (Ic):
Step (Ia); Step of preparing a liquid (S) containing the metal oxide (A);
Step (Ib); Step of preparing a solution (T) containing the phosphorus compound (B); and
Step (Ic); Step of mixing the liquid (S) and the solution (T) obtained in the above steps (Ia) and (Ib).

The step (Ib) may be performed before the step (Ia), simultaneously with the step (Ia), or after the step (Ia). Hereinafter, each step is described more specifically.

In the step (Ia), the liquid (S) containing the metal oxide (A) is prepared. The liquid (S) is a solution or a dispersion. The liquid (S) can be prepared, for example, by a technique employed in a known sol-gel method. For example, the liquid (S) can be prepared by mixing the above-mentioned compound (L)-based component and water, and, as needed, an acid catalyst or an organic solvent, and then subjecting the compound (L)-based component to condensation or hydrolysis condensation using a technique employed in a known sol-gel method. A dispersion of the metal oxide (A) obtained by condensation or hydrolysis condensation of the compound (L)-based component can be used as the liquid (S) containing the metal oxide (A) as it is. However, the dispersion may be subjected to a specific treatment (such as peptization, or adjustment of the amount of the solvent for controlling the concentration), as needed.

The content of the metal oxide (A) in the liquid (S) is preferably in the range of 0.1 to 30 mass %, more preferably in the range of 1 to 20 mass %, even more preferably in the range of 2 to 15 mass %.

In the step (Ib), the solution (T) containing the phosphorus compound (B) is prepared. The solution (T) can be prepared by dissolving the phosphorus compound (B) in a solvent. When the phosphorus compound (B) has low solubility, heat treatment or ultrasonic treatment may be performed to promote the dissolution.

The content of the phosphorus compound (B) in the solution (T) is preferably in the range of 0.1 to 99 mass %, more preferably in the range of 0.1 to 95 mass %, and even more preferably in the range of 0.1 to 90 mass %. The content of the phosphorus compound (B) in the solution (T) may be in the range of 0.1 to 50 mass %, may be in the range of 1 to 40 mass %, or may be in the range of 2 to 30 mass %.

In the step (Ic), the liquid (S) and the solution (T) are mixed. In the mixing of the liquid (S) and the solution (T), it is preferable to mix them under vigorous stirring while suppressing the addition rate, so as to suppress local reactions. In this regard, the solution (T) may be added to the liquid (S) under stirring, or the liquid (S) may be added to the solution (T) under stirring. The coating liquid (U) with excellent storage stability can be obtained in some cases by maintaining the temperature during the mixing at 30° C. or lower (for example, 20° C. or lower). Furthermore, the coating liquid (U) with excellent storage stability can be obtained in some cases by stirring for about another 30 minutes continuously from the completion of the mixing.

The coating liquid (U) may contain at least one acid compound selected from acetic acid, hydrochloric acid, nitric acid, trifluoroacetic acid, and trichloroacetic acid, as needed. The coating liquid (U) containing any of the above-mentioned acid compounds allows the reaction rate between the metal oxide (A) and the phosphorus compound (B) to decrease when the liquid (S) and the solution (T) are mixed in the step (Ic), as a result of which the coating liquid (U) with excellent aging stability can be obtained in some cases.

The content of the acid compound in the coating liquid (U) is preferably in the range of 0.1 to 5.0 mass %, and more preferably in the range of 0.5 to 2.0 mass %. In such a range, not only the effects due to the addition of the above-mentioned acid compound can be obtained but also the acid compound can be easily removed. In the case where an acid component remains in the liquid (S), the amount of the above-mentioned acid compound to be added can be determined in consideration of the residual amount of the acid component.

The liquid obtained by the mixing in the step (Ic) can be used as the coating liquid (U) as it is. In this case, the solvent contained in the liquid (S) or the solution (T) usually serves as a solvent for the coating liquid (U). The coating liquid (U) may be prepared by treating the liquid obtained by the mixing in the step (Ic). For example, treatments such as addition of an organic solvent, adjustment of the pH, adjustment of the viscosity, and addition of an additive may be performed.

The coating liquid (U) may contain substances other than the above-mentioned substances, as long as the effects of the present invention are obtained. For example, the coating liquid (U) may contain: a metal salt of an inorganic acid such as carbonate, hydrochloride, nitrate, hydrogencarbonate, sulfate, hydrogensulfate, borate, or aluminate; a metal salt of an organic acid such as oxalate, acetate, tartrate, or stearate; a metal complex such as an acetylacetonate metal complex (e.g., aluminum acetylacetonate), a cyclopentadienyl metal complex (e.g., titanocene), or a cyano metal complex; a layered clay compound; a crosslinking agent; a polymeric compound other than the polymer (C); a plasticizer; an antioxidant; an ultraviolet absorber; and a flame retardant.

[Step (II)]

In the step (II), the coating liquid (U) is applied onto the substrate (X) so as to form a precursor layer of the layer (Y) on the substrate (X). The coating liquid (U) may be applied directly onto at least one surface of the substrate (X). Before the coating liquid (U) is applied, the adhesive agent layer (H) may be formed on the surface of the substrate (X) by treating the surface of the substrate (X) with a known anchor coating agent, or applying a known adhesive agent onto the surface of the substrate (X).

The method for applying the coating liquid (U) onto the substrate (X) is not particularly limited, and a known method can be employed. Preferred examples of the method include casting, dipping, roll coating, gravure coating, screen printing, reverse coating, spray coating, kiss coating, die coating, metering rod coating, chamber doctor coating, curtain coating, etc.

Usually, in the step (II), the solvent in the coating liquid (U) is removed so as to form the precursor layer of the layer (Y). The method for removing the solvent is not particularly limited, and a known drying method can be used. Specifically, a drying method such as hot-air drying, hot roll contact drying, infrared heating, and microwave heating can be used alone or in combination. The drying temperature is preferably lower than the flow initiation temperature of the substrate (X) by at least 0° C. to 15° C. In the case where the coating liquid (U) contains the polymer (C), the drying temperature is preferably lower than the thermal decomposition initiation temperature of the polymer (C) by at least 15° C. to 20° C. The drying temperature is preferably in the range of 70° C. to 200° C., more preferably in the range of 80° C. to 180° C., and even more preferably in the range of 90° C. to 160° C. The removal of the solvent may be performed either under normal pressure or under reduced pressure. Alternatively, the solvent may be removed by heat treatment in the step (III) described later.

In the case where the layers (Y) are stacked on both surfaces of the layered substrate (X), a first layer (precursor layer of the first layer (Y)) may be formed by applying the coating liquid (U) onto one surface of the substrate (X) followed by removal of the solvent, and then a second layer (precursor layer of the second layer (Y)) may be formed by applying the coating liquid (U) onto the other surface of the substrate (X) followed by removal of the solvent. The composition of the coating liquid (U) applied to one surface may be the same as or different from that applied to the other surface.

[Step (III)]

In the step (III), the precursor layer (precursor layer of the layer (Y)) formed in the step (II) is treated so as to form the layer (Y). Examples of the method for treating the precursor layer include heat treatment and irradiation with electromagnetic waves, for example, with ultraviolet rays. The treatment to be performed in the step (III) may be a process of causing a reaction between the metal oxide (A) and the phosphorus compound (B). The treatment to be performed in the step (III), for example, may be a process of allowing the particles of the metal oxide (A) to be bonded to each other via a phosphorus atom derived from the phosphorus compound (B) by a reaction between the metal oxide (A) and the phosphorus compound (B). Generally, the step (III) is a step of heat-treating the precursor layer at a temperature of 110° C. or higher. In the infrared absorption spectrum of the precursor layer, the maximum absorbance ($A^{1'}$) in the range of 800 to 1400 cm$^{-1}$ and the maximum absorbance ($A^{2'}$) in the range of 2500 to 4000 cm$^{-1}$ due to stretching vibration of hydroxyl groups may satisfy the relationship of Absorbance ($A^{2'}$)/Absorbance ($A^{1'}$)>0.2, in some cases, which however is not particularly restrictive.

In the step (III), a reaction in which the particles of the metal oxide (A) are bonded to each other via a phosphorus atom (phosphorus atom derived from the phosphorus compound (B)) proceeds. From another aspect, a reaction in which the reaction product (R) is produced proceeds in the step (III). In order to allow such a reaction to proceed sufficiently, the heat treatment temperature is at least 110° C., preferably at least 120° C., more preferably at least 140° C., and even more preferably at least 170° C. If the heat treatment temperature is low, it takes a long time to obtain a sufficient degree of reaction, thus causing a decrease in productivity. A preferred upper limit of the heat treatment temperature varies depending on, for example, the type of the substrate (X). For example, in the case where a thermoplastic resin film made of polyamide resin is used as the substrate (X), the heat treatment temperature is preferably 190° C. or lower. In the case where a thermoplastic resin film made of polyester resin is used as the substrate (X), the heat treatment temperature is preferably 220° C. or lower. The heat treatment can be carried out in the air, a nitrogen atmosphere, an argon atmosphere, or the like.

Duration of the heat treatment is preferably in the range of 0.1 second to 1 hour, more preferably in the range of 1 second to 15 minutes, and even more preferably in the range of 5 to 300 seconds. In one example, the heat treatment is carried out in the range of 110° C. to 220° C. for 0.1 second to 1 hour. In another example, the heat treatment is carried out in the range of 120° C. to 200° C. for 5 to 300 seconds (for example, 60 to 300 seconds).

In the case of treating the surface of the substrate (X) with a known anchor coating agent or applying a known adhesive agent onto the surface of the substrate (X) before the application of the coating liquid (U) in order to dispose the adhesive agent layer (H) between the substrate (X) and the layer (Y), aging treatment is preferably performed. Specifically, the substrate (X) coated with the coating liquid (U) is preferably allowed to stand at a relatively low temperature for a long period of time, after the application of the coating liquid (U) but before the heat treatment step of the step (III). The temperature of the aging treatment is preferably lower than 110° C., more preferably 100° C. or lower, and even more preferably 90° C. or lower. The temperature of the aging treatment is preferably at least 10° C., more preferably at least 20° C., and even more preferably at least 30° C. The duration of the aging treatment is preferably in the range of 0.5 to 10 days, more preferably in the range of 1 to 7 days, and even more preferably in the range of 1 to 5 days. The adhesion between the substrate (X) and the layer (Y) is further enhanced by performing this aging treatment.

A barrier film including the substrate (X) and the layer (Y) is obtained by the above-described steps. In the case where the multilayer structure of the present invention includes a layer other than the barrier film, the barrier film and the other film are stacked together. The method for stacking them is not limited, and stacking using an adhesive layer or stacking by heat lamination may be used.

A preferred example of the roll-to-roll production of the above-described multilayer structure is described below. This example includes steps (i), (ii), and (iii). In the step (i), the substrate (X) is fed from a first roll of the substrate (X) in a feed direction (MD) in such a manner that the feed direction coincides with the direction (D) (in which the 3% strain tension is at least 2000 N/m). In the step (ii), a precursor layer of the barrier layer (layer (Y)) is formed on the substrate (X). In the step (iii), the substrate (X), which has undergone the step (ii), is wound on a second roll. Here, the step (ii) includes the above-described steps (I) and (II).

According to this example production method, it is possible to suppress deterioration of the barrier properties of the layer (Y) due to excessive stretching of the substrate (X) in the continuous formation of the layer (Y). Therefore, according to this production method, it is possible to produce a multilayer structure having excellent barrier properties with high productivity.

In the step (iii), the substrate (X), on which the precursor layer of the layer (Y) has been formed, may be wound on the second roll. In this case, it is also possible to age the second roll of the substrate (X) on which the precursor layer has been formed.

In the step (iii), the substrate (X), on which the layer (Y) has been formed, may be wound on the second roll. In this case, the production method further includes a step of treating the precursor layer formed in the step (ii), after the step (ii) but before the step (iii), so as to form the barrier layer (layer (Y)) on the substrate (X). This step corresponds to the above-described step (III). This means that, in this case, the layer (Y) is formed on the substrate (X) by performing the above-described steps of forming the layer (Y) (steps (I), (II) and (III)) between the step (i) and the step (iii).

Focusing on a specific portion of the substrate (X), the above-described steps (i), (ii) and (iii) are performed in this order. However, focusing on the entire substrate (X), the steps (i), (ii), and (iii) are usually performed simultaneously (except at the start and end of the production).

In the case where the multilayer structure of the present invention includes a layer (for example, a surface protective layer) other than the barrier film, the other layer is stacked on the substrate (X) at any stage. In this case, the other layer may be stacked directly on the substrate (X) or with a layer (for example the layer (Y), the precursor layer of the layer (Y), or the like) other than the substrate (X) interposed therebetween, according to the structure of a multilayer structure to be formed. The timing of stacking the other layer on the substrate (X) is not particularly limited. The other layer may be stacked on the substrate (X) before the step (i), between the step (i) and the step (ii), between the step (ii) and the step (iii), or after the step (iii). Usually, the layer (Y) is formed on the substrate (X), and then the surface protective layer is stacked on the substrate (X) with the layer (Y) interposed therebetween.

In a preferred example of the method for stacking a layer (for example, a film) other than the barrier film on the substrate (X) (for example, the substrate (X) in the barrier film), the other layer is stacked on the substrate (X), with the substrate (x) being fed in such a manner that the feed direction (MD) coincides with the direction (D) of the substrate (X).

An example of the method for producing a flexible device including a protective sheet for protecting the surface of the device is described below. This production method includes steps (a) and (b). In the step (a), a protective sheet that is wound on a roll and that includes a substrate (X) whose 3% strain tension in at least one direction is at least 2000 N/m and a barrier layer (layer (Y)) formed on the substrate (X) is prepared. This protective sheet is the multilayer structure of the present invention. In the step (b), a flexible base on which an element is formed is moved, and simultaneously, the protective sheet is fed from the roll in such a manner that the feed direction (MD) coincides with the one direction (direction (D)), so as to stack the protective sheet on the base to cover the element. In this production method, deterioration of the barrier properties of the barrier layer can be suppressed even if the protective layer is fed under tension in the feed direction.

In a typical example of the above-described method, a flexible base is wound on a feed roll, from which the base is fed. The protective sheet is stacked on the base, and then wound on a wound-up roll. That is, the step of stacking the protective sheet may be performed by the roll-to-roll process. In this case, the base on which an element has previously been formed may be wound on the feed roll. Alternatively, the base on which an element has not been formed may be wound on the feed roll. That is, the element may be formed on the moving base and then the protective sheet may be stacked to cover the element. The device formed by this method is not particularly limited, and the device may be any of the above-mentioned devices (such as a solar cell, a display, or a lighting device). Specifically, the element formed on the base may be a solar cell element, an element constituting a display (display element), or an element constituting a lighting device (light-emitting element).

EXAMPLES

Hereinafter, the present invention will be described more specifically by way of Examples. However, the present invention is not limited in any way by the following Examples. The measurement and evaluation in Examples and Comparative Examples were performed by the following methods.

(1) 3% Strain Tension of the Substrate

A roll of substrate was cut into a strip with a width of 1.5 cm and a length of 15 cm extending in a feed direction (MD) in which the substrate is to be fed. This specimen was stretched 3% in the length direction under the conditions of 23° C. and 50% RH, and the 3% strain tension of the specimen thus stretched was measured, using an autograph ("AGS-H" manufactured by SHIMADZU CORPORATION) according to JIS K 7127. The 3% strain tension (N/m) was calculated in terms of unit width (1 m).

(2) Vapor Transmission Rate

The vapor transmission rate (water vapor transmission rate; WVTR) was measured using a water vapor transmission rate tester ("GTR-WV" manufactured by GTR Tec Corporation) according to gas chromatography (JIS K 7129 C). Specifically, the vapor transmission rate (unit: $g/(m^2 \cdot day)$) was measured under the conditions of a temperature of 40° C., a humidity on the water vapor supply side of 90% RH, and a humidity on the carrier gas side of 0% RH.

Ten pieces were sampled from a produced roll of multilayer structure (the first portion of winding, end portion of winding, middle portion between them, etc.) to measure the water vapor transmission rates thereof. The average vapor transmission rate and the stability ($\sigma$) of the vapor transmission rate were calculated from the measured values of the ten samples. The stability ($\sigma$) is the standard deviation of the 10 measured values and is a measure of the variation in the water vapor barrier properties of the multilayer structure when it is produced. The lower the stability ($\sigma$) value is, the smaller the variation in the properties of the multilayer structure is when it is produced.

(3) Oxygen Transmission Rate

The oxygen transmission rate (OTR) was measured using an oxygen transmission rate tester ("MOCON OX-TRAN 2/20", manufactured by Modern Controls, Inc.). Specifically, the oxygen transmission rate (unit: $ml/(m^2 \cdot day \cdot atm)$) was measured under the conditions of a temperature of 20° C., a humidity on the oxygen supply side of 85% RH, a humidity on the carrier gas side of 85% RH, an oxygen pressure of 1 atm, and a career gas pressure of 1 atm. As the carrier gas, nitrogen gas containing 2 vol % of hydrogen gas was used.

Ten pieces were sampled from a produced roll of multilayer structure (the first portion of winding, end portion of winding, middle portion between them, etc.) to measure the oxygen transmission rates thereof, in the same manner as for the above-described vapor transmission rates. The average oxygen transmission rate and the stability ($\sigma$) of the oxygen transmission rate were calculated from the measured values of the ten samples. The stability ($\sigma$) is the standard deviation of the 10 measured values and is a measure of the variation in the oxygen barrier properties of the multilayer structure when it is produced. The lower the stability ($\sigma$) value is, the smaller the variation in the properties of the produced multilayer structure is.

Example 1

230 parts by mass of distilled water was heated to 70° C. under stirring. 88 parts by mass of aluminum isopropoxide was added dropwise to the distilled water over 1 hour, and then the liquid temperature was gradually raised to 95° C. so that the generated isopropanol was distilled off. Thus, hydrolysis condensation was performed. Subsequently, 4.0 parts by mass of a 60-mass % nitric acid aqueous solution was added thereto, which was stirred at 95° C. for 3 hours, thereby peptizing aggregated particles of the hydrolysis condensate. The resultant dispersion was concentrated to a solid content concentration of 10 mass % in terms of alumina. Thus, a dispersion (S1) was obtained.

Meanwhile, 42.85 parts by mass of distilled water, 19.00 parts by mass of methanol, and 1.39 parts by mass of trifluoroacetic acid were added to 1.76 parts by mass of a 85-mass % phosphoric acid aqueous solution, and the resultant mixture was stirred homogeneously. Thus, a solution (T1) was obtained. Subsequently, while the solution (T1) was stirred, 35.00 parts by mass of the dispersion (S1) was added dropwise thereto, which was stirred for another 30 minutes continuously after the completion of the addition. Thus, a coating liquid (U1) was obtained.

Next, a roll of biaxially stretched polyethylene terephthalate film (which may hereinafter be abbreviated as "PET") was prepared as a substrate. As the substrate, the film with a thickness of 25 µm and under a 3% strain tension of 3600 N/m in the MD was used. One surface of the substrate was continuously coated with the coating liquid (U1) by gravure coating so that the coating with a thickness of 0.5 µm was formed after drying, and then dried in a hot air drying oven at 100° C. Next, the other surface of the substrate was continuously coated with the coating liquid (U1) by gravure coating so that the coating with a thickness of 0.5 µm was formed after drying, and then dried in a hot air drying oven at 100° C. The resultant substrate was wound on a roll. Thus, precursor layers of the layers (Y) were formed.

The obtained precursor layers were subjected to heat treatment at 200° C. for one minute by being passed through a hot air drying oven. Thus, a multilayer structure (A1) having a structure of Layer (Y) (0.5 µm)/PET (25 µm)/Layer (Y) (0.5 µm) was obtained. The multilayer structure (A1) thus obtained was subjected to evaluation by the methods described above.

Example 2

In Example 2, a PET film with a thickness of 50 µm and under a 3% strain tension of 7200 N/m was used as the substrate. Thus, a multilayer structure (A2) having a structure of Layer (Y) (0.5 µm)/PET (50 µm)/Layer (Y) (0.5 µm) was obtained in the same manner as in Example 1, except that the substrate was changed. The multilayer structure (A2) thus obtained was subjected to evaluation by the methods described above.

Example 3

In Example 3, a polycarbonate film (which may hereinafter be abbreviated as "PC") with a thickness of 50 µm and under a 3% strain tension of 3000 N/m was used as the substrate. Thus, a multilayer structure (A3) having a structure of Layer (Y) (0.5 µm)/PC (50 µm)/Layer (Y) (0.5 µm) was obtained in the same manner as in Example 1, except that the substrate was changed. The multilayer structure (A3) thus obtained was subjected to evaluation by the methods described above.

Example 4

In Example 4, a multilayer structure (A4) having a structure of Layer (Y) (0.5 µm)/PET (25 µm) was obtained in the same manner as in Example 1, except that the layer (Y) was formed on only one of the surfaces of the substrate. The multilayer structure (A4) thus obtained was subjected to evaluation by the methods described above.

Example 5

In Example 5, a layered body of a 50 µm-thick PET and a 100 µm-thick cyclic olefin copolymer (which may hereinafter be abbreviated as "COC") was used as the substrate. The 3% strain tension of this substrate was 21600 N/m. The COC surface was subjected to corona discharge treatment. Thus, a multilayer structure (A5) having a structure of PET (50 µm)/COC (100 µm)/Layer (Y) (0.5 µm) was obtained in the same manner as in Example 1, except that the substrate was changed and the layer (Y) was formed on only the COC surface of the substrate. The multilayer structure (A5) thus obtained was subjected to evaluation by the methods described above.

Example 6

53.43 parts by mass of distilled water, 5.00 parts by mass of a 10-mass % polyvinyl alcohol aqueous solution, 19.00 parts by mass of methanol, and 1.39 parts by mass of trifluoroacetic acid were added to 3.18 parts by mass of a 85-mass % phosphoric acid aqueous solution, and the resultant mixture was stirred homogeneously. Thus, a solution (T6) was obtained. Subsequently, while the solution (T6) was stirred, 18.00 parts by mass of the dispersion (S1) obtained in Example 1 was added dropwise thereto, which was stirred for another 30 minutes continuously after the completion of the addition. Thus, a coating liquid (U6) was obtained.

A multilayer structure (A6) having a structure of Layer (Y) (0.5 µm)/PET (25 µm)/Layer (Y) (0.5 µm) was obtained in the same manner as in Example 1, except that the coating liquid (U6) was used instead of the coating liquid (U1). The multilayer structure (A6) thus obtained was subjected to evaluation by the methods described above.

Comparative Example 1

In Comparative Example 1, a PET with a thickness of 12 µm and under a 3% strain tension of 1700 N/m was used as the substrate. Thus, a multilayer structure (C1) having a structure of Layer (Y) (0.5 µm)/PET (12 µm)/Layer (Y) (0.5 µm) was obtained in the same manner as in Example 1, except that the substrate was changed. The multilayer structure (C1) thus obtained was subjected to evaluation by the methods described above.

Comparative Example 2

In Comparative Example 2, a stretched nylon film (which may hereinafter be abbreviated as "ONY") with a thickness of 15 µm and under a 3% strain tension of 1100 N/m was used as the substrate. Thus, a multilayer structure (C2) having a structure of Layer (Y) (0.5 µm)/ONY (15 µm)/Layer (Y) (0.5 µm) was obtained in the same manner as in Example 1, except that the substrate was changed. The multilayer structure (C2) thus obtained was subjected to evaluation by the methods described above.

Table 1 shows the production conditions and evaluation results of the multilayer structures.

TABLE 1

| | Substrate | | | | Vapor transmission rate | | Coefficient of variation (σ/average value) | Oxygen transmission rate | |
|---|---|---|---|---|---|---|---|---|---|
| | Material | Thickness (μm) | 3% strain tension (N/m) | Surface on which Layer (Y) is formed | Average value (mg/(m² · day)) | Stability (σ) | | Average value (ml/(m² · day · atm)) | Stability (σ) |
| EX. 1 | PET | 25 | 3600 | Both surfaces | 1.3 | 0.68 | 0.523 | <0.1 | — |
| EX. 2 | PET | 50 | 7200 | Both surfaces | 1.3 | 0.44 | 0.338 | <0.1 | — |
| EX. 3 | PC | 50 | 3000 | Both surfaces | 0.92 | 0.22 | 0.239 | <0.1 | — |
| EX. 4 | PET | 25 | 3600 | One surface | 78.9 | 11 | 0.139 | <0.1 | — |
| EX. 5 | PET/COC | 150 | 21600 | One surface | 81.2 | 6.9 | 0.085 | <0.1 | — |
| EX. 6 | PET | 25 | 3600 | Both surfaces | 1.9 | 0.52 | 0.274 | <0.1 | — |
| C. EX. 1 | PET | 12 | 1700 | Both surfaces | 61 | 160 | 2.623 | <0.1 | — |
| C. EX. 2 | ONY | 15 | 1100 | Both surfaces | 64 | 190 | 2.969 | <0.1 | — |

"—" indicates no value because an average value cannot be calculated.

As shown in Table 1, when a substrate whose 3% strain tension is at least 2000 N/m was used, a multilayer structure having highly stable barrier properties was obtained. When a substrate under a low 3% strain tension was used, the average vapor transmission rate was low and the vapor transmission rate varied significantly.

Example 7

In Example 7, a protective sheet for solar cells was produced using the multilayer structure (A1) of Example 1. First, a layered film having a structure of Acrylic resin layer (with a thickness of 50 μm)/Polyvinyl butyral layer (with a thickness of 20 μm) was produced by co-extrusion using an acrylic resin and polyvinyl butyral. This layered film and the multilayer structure (A1) of Example 1 were heat-laminated at 170° C. Thus, a protective sheet (A7) having a structure of Acrylic resin layer/Polyvinyl butyral layer/Multilayer structure (A1) was produced.

One example of the use of the above-mentioned protective sheet (A7) as a sheet for protecting the light incident surface of a solar cell is described. First, a solar cell including a flexible base and a solar cell element formed thereon is prepared. This example solar cell is a solar cell that generates electric power from light incident on the surface opposite to the base. The protective sheet (A7) is stacked on the base to cover the solar cell element. Thus, a solar cell in which the light incident surface is protected with the protective sheet (A7) is obtained. Since the multilayer structure of the present invention has excellent barrier properties, flexibility, light transmission properties, and weather resistance, the use of the multilayer structure of the present invention allows a high-performance flexible solar cell to be obtained.

Example 8

In Example 8, a protective sheet for solar cells was produced using the multilayer structure (A1) of Example 1. First, a layered film having a structure of Acrylic resin layer (with a thickness of 50 μm)/Polyvinyl acetal layer (with a thickness of 20 μm) was formed by co-extrusion using an acrylic resin and polyvinyl acetal (acetaldehyde/butylaldehyde=51 moles/49 moles, content of acetal of 78 mass %) obtained by acetalizing polyvinyl alcohol having an average polymerization degree of 1000 and a saponification degree of 99% with acetaldehyde and butylaldehyde. This layered film and the multilayer structure (A1) of Example 1 were heat-laminated at 170° C. Thus, a protective sheet (A8) having a structure of Acrylic resin layer/Polyvinyl acetal layer/Multilayer structure (A1) was produced.

One example of the use of the above-mentioned protective sheet (A8) as a sheet for protecting the light incident surface of a solar cell is described. First, a solar cell including a flexible base and a solar cell element formed thereon is prepared. This example solar cell is a solar cell that generates electric power from light incident on the surface opposite to the base. The protective sheet (A8) is stacked on the base to cover the solar cell element. Thus, a solar cell in which the light incident surface is protected with the protective sheet (A8) is obtained. Since the multilayer structure of the present invention has excellent barrier properties, flexibility, light transmission properties, and weather resistance, the use of the multilayer structure of the present invention allows a high-performance flexible solar cell to be obtained.

Example 9

In Example 9, first, a single-layer acrylic resin film (with a thickness of 50 μm) was formed by extrusion using an acrylic resin. This single-layer film and the multilayer structure (A1) of Example 1 were laminated using a two-component reactive polyurethane adhesive agent. Thus, a protective sheet (A9) having a structure of Acrylic resin layer/Adhesive layer/Multilayer structure (A1) was produced.

The protective sheet (A9) was subjected to the radiant panel test (flame spread test) according to IEC 61730-1, 15.4.2 (see "Standard Test Method for Surface Flammability of Materials Using a Radiant Heat Energy Source", ASTM E162-02a), and as a result, the flame spread index was 89.

The protective sheet (A9) was subjected to the partial discharge (PD) test according to IEC 61730-2 "Photovoltaic (PV) module safety qualification, Part 2: Requirements for testing, 11.1", and as a result, the maximum permissible system voltage was 489 Vdc.

Meanwhile, a single-crystal solar cell module including the protective sheet (A9) as a cover member, an EVA sealing member with a thickness of 600 μm, a crystal SI element, an EVA sealing member with a thickness of 600 μm, and a back sheet with a total thickness of 122 μm that are stacked in this order was prepared. This module was subjected to the fire test according to IEC 61730-2, first edition, MST 23 (ANSI/UL790), and as a result, it was rated as Class C.

Example 10

In Example 10, a single-layer ethylene-tetrafluoroethylene copolymer resin film (with a thickness of 50 μm) having a corona-treated surface to be bonded and the multilayer structure (A1) of Example 1 were laminated using a two-component reactive polyurethane adhesive agent. Thus, a protective sheet (A10) having a structure of Ethylene-tetrafluoroethylene copolymer resin layer/Adhesive layer/Multilayer structure (A1) was produced. Thus, by using the above protective sheet (A10), a solar cell in which the light incident surface was protected with the protective sheet (A10) was fabricated in the same manner as in Example 7.

Example 11

In Example 11, the single-layer acrylic resin film (with a thickness of 50 μm) used in Example 9, the multilayer structure (A1) of Example 1, and a poly(ethylene terephthalate) film having improved adhesion to EVA (hereinafter abbreviated as an "EVA-easily-adhesive PET") (with a thickness of 50 μm) were laminated using a two-component reactive polyurethane adhesive agent. Thus, a protective sheet (A11) having a structure of Acrylic resin layer/Adhesive layer/Multilayer structure (A1)/Adhesive layer/EVA-easily-adhesive PET was produced. By using the above protective sheet (A11), a solar cell in which the light incident surface was protected with the protective sheet (A11) was fabricated in the same manner as in Example 7.

Example 12

In Example 12, the single-layer acrylic resin film (with a thickness of 50 μm) used in Example 9, the multilayer structure (A1) of Example 1, and an EVA-easily-adhesive PET (with a thickness of 50 μm) were laminated using a two-component reactive polyurethane adhesive agent. Thus, a protective sheet (A12) having a structure of Acrylic resin layer/Adhesive layer/Multilayer structure (A1)/Adhesive layer/Multilayer structure (A1)/Adhesive layer/EVA-easily-adhesive PET was produced. By using the above protective sheet (A12), a solar cell in which the light incident surface was protected with the protective sheet (A12) was fabricated in the same manner as in Example 8.

The properties of each of the solar cells fabricated in Examples 10 to 12 were not affected, although the surface thereof was covered with the protective sheet of the multilayer structure of the present invention.

<Multiple Structure Including Deposited Inorganic Layer>

Example 13

In Example 13, one surface of the 25-μm-thick PET used in Example 1 was subjected to vapor deposition of silicon oxide, and the layer (Y) was formed on the other surface opposite to the surface of the deposited silicon oxide layer in the same manner as in Example 1. Thus, a multilayer structure (A13) having a structure of Deposited silicon oxide layer (Z)/PET (25 μm)/Layer (Y) (0.5 μm) was obtained.

Example 14

In Example 14, one surface of the 25-μm-thick PET used in Example 1 was subjected to vapor deposition of silicon oxide, and the layer (Y) was formed on the deposited silicon oxide layer in the same manner as in Example 1. Thus, a multilayer structure (A14) having a structure of Layer (Y) (0.5 μm)/Deposited silicon oxide layer (Z)/PET (25 μm) was obtained.

Example 15

In Example 15, the layer (Y) was further formed on the PET surface of the multilayer structure (A14) obtained in Example 14 in the same manner as in Example 1. Thus, a multilayer structure (A15) having a structure of Layer (Y) (0.5 μm)/Deposited silicon oxide layer (Z)/PET (25 μm)/Layer (Y) (0.5 μm) was obtained.

Example 16

In Example 16, the layer (Y) formed on the substrate of the multilayer structure (A15) obtained in Example 15 was subjected to vapor deposition of silicon oxide. Thus, a multilayer structure (A16) having a structure of Layer (Y) (0.5 μm)/Deposited silicon oxide layer (Z)/PET (25 μm)/Layer (Y) (0.5 μm)/Deposited silicon oxide layer (Z) was obtained.

Example 17

In Example 17, both surfaces of the 25-μm-thick PET used in Example 1 were subjected to vapor deposition of silicon oxide, and the layers (Y) were formed on the surfaces of the deposited silicon oxide layers in the same manner as in Example 1. Thus, a multilayer structure (A17) having a structure of Layer (Y) (0.5 μm)/Deposited silicon oxide layer (Z)/PET (25 μm)/Deposited silicon oxide layer (Z)/Layer (Y) (0.5 μm) was obtained.

Example 18

In Example 18, a multilayer structure (A18) having a structure of Layer (Y) (0.5 μm)/Deposited silicon oxide layer (Z)/PEN (50 μm)/Layer (Y) (0.5 μm)/Deposited silicon oxide layer (Z) was obtained in the same manner as in Example 16, except that a biaxially stretched poly(ethylene terephthalate) film (which may hereinafter be abbreviated as "PEN") with a thickness of 50 μm was used instead of the PET used in Example 16. The PEN whose 3% strain tension in the MD is 8500 N/m was used.

Example 19

In Example 19, the layer (Y) formed on the substrate of the multilayer structure (A4) obtained in Example 4 was subjected to vapor deposition of silicon oxide. Thus, a multilayer structure (A19) having a structure of PET (25 μm)/Layer (Y) (0.5 μm)/Deposited silicon oxide layer (Z) was obtained.

Example 20

In Example 20, one of the layers (Y) formed on the substrate of the multilayer structure (A1) obtained in Example 1 was subjected to vapor deposition of silicon oxide. Thus, a multilayer structure (A20) having a structure of Layer (Y) (0.5 μm)/PET (25 μm)/Layer (Y) (0.5 μm)/Deposited silicon oxide layer (Z) was obtained.

Example 21

In Example 21, both of the layers (Y) formed on the substrate of the multilayer structure (A1) obtained in Example 1 were subjected to vapor deposition of silicon oxide. Thus, a multilayer structure (A21) having a structure of Deposited silicon oxide layer (Z)/Layer (Y) (0.5 μm)/PET (25 μm)/Layer (Y) (0.5 μm)/Deposited silicon oxide layer (Z) was obtained.

Example 22

In Example 22, a multilayer structure (A22) having a structure of Deposited silicon oxide layer (Z)/Layer (Y) (0.5 μm)/PEN (50 μm)/Layer (Y) (0.5 μm)/Deposited silicon oxide layer (Z) was obtained in the same manner as in Example 1 and Example 21, except that the PEN used in Example 18 was used instead of the PET used in Example 21.

For the multilayer structures thus obtained in Examples 13 to 22, the vapor transmission rates and the oxygen transmission rates were measured by the above-described methods. Table 2 shows the evaluation results. As shown in Table 2, the multilayer structures having highly stable barrier properties were obtained.

Example 23

In Example 23, the single-layer acrylic resin film (with a thickness of 50 μm) used in Example 9, the multilayer structure (A21) of Example 21, and an EVA-easily-adhesive PET (with a thickness of 50 μm) were laminated using a two-component reactive polyurethane adhesive agent. Thus, a protective sheet (A23) having a structure of Acrylic resin layer/Adhesive layer/Multilayer structure (A21)/Adhesive layer/EVA-easily-adhesive PET was produced.

By using the above protective sheet (A23), a solar cell in which the light incident surface was protected with the protective sheet (A23) was fabricated in the same manner as in Example 7.

Example 24

In Example 24, the single-layer acrylic resin film (with a thickness of 50 μm) used in Example 9, the multilayer structure (A22) of Example 22, and an EVA-easily-adhesive PET (with a thickness of 50 μm) were laminated using a two-component reactive polyurethane adhesive agent. Thus, a protective sheet (A24) having a structure of Acrylic resin layer/Adhesive layer/Multilayer structure (A22)/Adhesive layer/EVA-easily-adhesive PET was produced.

By using the above protective sheet (A24), a solar cell in which the light incident surface was protected with the protective sheet (A24) was fabricated in the same manner as in Example 7.

The properties of each of the solar cells fabricated in Examples 23 and 24 were not affected, although the surface thereof was covered with the protective sheet of the multilayer structure of the present invention.

For each of the multilayer structures obtained in Examples 1 to 6, Examples 13 to 22, and Comparative Examples 1 and 2, the infrared absorption spectrum of the layer (Y) was measured by the method described in paragraphs 0198 to 0200 of Patent Literature 3, and thereby the maximum absorption wavenumber ($n^1$) in the range of 800 to 1400 cm$^{-1}$ was obtained. As a result, all these multilayer structures had the maximum absorption wavenumbers ($n^1$) in the range of 1090 to 1110 cm$^{-1}$.

TABLE 2

| | | Vapor transmission rate | | | Oxygen transmission rate | |
|---|---|---|---|---|---|---|
| | Layer structure of Multilayer structure | Average value (mg/(m$^2$ · day)) | Stability (σ) | Coefficient of variation (σ/average value) | Average value (ml/(m$^2$ · day · atm)) | Stability (σ) |
| EX. 13 | (Z)/PET/(Y) | 3.1 | 0.52 | 0.168 | <0.1 | — |
| EX. 14 | (Y)/(Z)/PET | 4.2 | 0.82 | 0.195 | <0.1 | — |
| EX. 15 | (Y)/(Z)/PET/(Y) | <0.1 | — | — | <0.1 | — |
| EX. 16 | (Y)/(Z)/PET/(Y)/(Z) | <0.1 | — | — | <0.1 | — |
| EX. 17 | (Y)/(Z)/PET/(Z)/(Y) | <0.1 | — | — | <0.1 | — |
| EX. 18 | (Y)/(Z)/PEN/(Y)/(Z) | <0.1 | — | — | <0.1 | — |
| EX. 19 | PET/(Y)/(Z) | 3.6 | 0.63 | 0.175 | <0.1 | — |
| EX. 20 | (Y)/PET/(Y)/(Z) | <0.1 | — | — | <0.1 | — |
| EX. 21 | (Z)/(Y)/PET/(Y)/(Z) | <0.1 | — | — | <0.1 | — |
| EX. 22 | (Z)/(Y)/PEN/(Y)/(Z) | <0.1 | — | — | <0.1 | — |

(Z): Deposited inorganic layer
"—" indicates no value because an average value cannot be calculated.

INDUSTRIAL APPLICABILITY

The present invention can be used in a multilayer structure and a device using the same.

The invention claimed is:
1. A multilayer structure comprising:
a substrate;
a protective layer that is an outermost layer of the multilayer structure;
a barrier layer stacked on the substrate between the substrate and the protective layer;
wherein:
a 3% strain tension of the substrate in at least one direction is at least 2000 N/m,
the barrier layer comprises a reaction product (R) formed by a reaction at least between a metal oxide (A) and a phosphorus compound (B), in an infrared absorption spectrum of the barrier layer in a range of 800 to 1400 cm$^{-1}$, a wavenumber (n$^1$) at which maximum infrared absorption occurs is in a range of 1080 to 1130 cm$^{-1}$, a metal atom of the metal oxide (A) is essentially an aluminum atom, the protective layer consists of a resin or the resin containing an ultraviolet absorber, the resin comprises (1) an ethylene-tetrafluoroethylene copolymer or (2) an acrylic resin, when the resin comprises an acrylic resin (2), the multilayer structure further comprises an adhesive layer disposed on the protective layer between the substrate and the protective layer, and the adhesive layer comprises a polyvinyl acetal.

2. The multilayer structure according to claim 1, wherein the phosphorus compound (B) has a plurality of sites capable of reacting with the metal oxide (A).

3. The multilayer structure according to claim 1, wherein the metal oxide (A) is a hydrolyzed condensate of a compound (L) comprising the metal atom to which a hydrolyzable characteristic group is bonded.

4. The multilayer structure according to claim 3, wherein the compound (L) comprises at least one compound (L$^1$) represented by the formula (I):

$$AlX^1_m R^1_{(3-m)} \qquad (I),$$

wherein:

X$^1$ is selected from the group consisting of F, Cl, Br, I, R$^2$O—, R$^3$C(=O)O—, (R$^4$C(=O))$_2$CH—, and NO$_3$;

R$^1$, R$^2$, R$^3$, and R$^4$ each independently is selected from the group consisting of an alkyl group, an aralkyl group, an aryl group, and an alkenyl group; and m is an integer of 1 to 3; and wherein:

when a plurality of X$^1$ are present in the formula (I), the plurality of X$^1$ are the same or different from each other;

when a plurality of R$^1$ are present in the formula (I), the plurality of R$^1$ are the same or different from each other;

when a plurality of R$^2$ are present in the formula (I), the plurality of R$^2$ are the same as or different from each other;

when a plurality of R$^3$ are present in the formula (I), the plurality of R$^3$ are the same or different from each other; and when a plurality of R$^4$ are present in the formula (I), the plurality of R$^4$ are the same or different from each other.

5. The multilayer structure according to claim 1, wherein the phosphorus compound (B) is selected from the group consisting of phosphoric acid, polyphosphoric acid, phosphorous acid, phosphonic acid, and a derivative thereof.

6. The multilayer structure according to claim 1, wherein the barrier layer is stacked on first and second surfaces of the substrate.

7. The multilayer structure according to claim 1, wherein the multilayer structure has a vapor transmission rate, under conditions of 40° C. and 90/0% RH, of not more than 0.005 g/(m$^2$·day).

8. A device comprising a protective sheet for protecting a surface of the device, wherein the protective sheet is the multilayer structure according to claim 1.

9. The device according to claim 8, wherein the device is a solar cell, a display, or a lighting device.

10. The device according to claim 8, wherein the device is a flexible device.

11. A method for producing the multilayer structure according to claim 1, the method comprising:

(i) feeding a substrate from a first roll of the substrate in a feed direction in such a manner that the feed direction coincides with the at least one direction;

(ii) forming a precursor layer of a barrier layer on the substrate; and (iii) winding the substrate, which has undergone (ii), on a second roll, wherein (ii) comprises:

mixing a metal oxide (A), at least one compound having a site capable of reacting with the metal oxide (A), and a solvent, thereby preparing a coating liquid (U) comprising the metal oxide (A), the at least one compound, and the solvent; and applying the coating liquid (U) onto the substrate, thereby forming the precursor layer on the substrate, wherein the at least one compound comprises a phosphorus compound (B), the number of moles of metal atom present in the at least one compound is in a range of 0 to 1 times the number of moles of phosphorus atom present in the phosphorus compound (B), and a metal atom of the metal oxide (A) is essentially an aluminum atom.

12. The method according to claim 11, further comprising treating the precursor layer after (ii) and before (iii), thereby forming the barrier layer on the substrate.

13. A method for producing a flexible device comprising a protective sheet for protecting a surface of the device, the method comprising:

(a) preparing a protective sheet that is wound on a roll and that comprises a substrate whose 3% strain tension in at least one direction is at least 2000 N/m and a barrier layer is formed on the substrate; and (b) moving a flexible base of the flexible device on which an element is formed, and simultaneously feeding the protective sheet from the roll in a feed direction in such a manner that the feed direction coincides with the at least one direction, thereby stacking the protective sheet on the base to cover the element, wherein the protective sheet is the multilayer structure according to claim 1.

14. The multilayer structure according to claim 1, wherein a coefficient of variation of a vapor transmission rate of the multilayer structure is from 0.085 to 0.523, the coefficient of variation is obtained by dividing a stability of the vapor transmission rate by an average value, mg/(m2·day), of the vapor transmission rate, the average value and the stability of the vapor transmission rate are calculated from measured values of the vapor transmission rates of ten pieces sampled from the multilayer structure, and the stability of the vapor transmission rate means a standard deviation of the measured values.

15. A multilayer structure comprising:

a substrate;

a protective layer that is an outermost layer of the multilayer structure;

an adhesive layer disposed on the protective layer between the substrate and the protective layer;

a barrier layer stacked on the substrate;

wherein:

a 3% strain tension of the substrate in at least one direction is at least 2000 N/m, the barrier layer comprises a reaction product (R) formed by a reaction at least between a metal oxide (A) and a phosphorus compound (B), in an infrared absorption spectrum of the barrier layer in a range of 800 to 1400 $cm^{-1}$, a wavenumber ($n^1$) at which maximum infrared absorption occurs is in a range of 1080 to 1130 $cm^{-1}$, a metal atom of the metal oxide (A) is essentially an aluminum atom, the protective layer comprises an acrylic resin, and the adhesive layer comprises polyvinyl acetal.

16. The multilayer structure according to claim 1, wherein, when the resin comprises the ethylene-tetrafluoroethylene copolymer (1), the multilayer structure further comprises an adhesive layer disposed on the protective layer between the substrate and the protective layer, and the adhesive layer comprises a two-component reactive polyurethane adhesive agent.

* * * * *